(12) United States Patent
Kim et al.

(10) Patent No.: US 12,108,638 B2
(45) Date of Patent: Oct. 1, 2024

(54) DISPLAY APPARATUS WITH EXPOSED PAD ELECTRODE

(71) Applicant: SAMSUNG DISPLAY CO., LTD., Yongin-si (KR)

(72) Inventors: Jongin Kim, Yongin-si (KR); Hyunseong Kang, Yongin-si (KR); Joongeol Kim, Yongin-si (KR); Seokhwan Bang, Yongin-si (KR); Seungsok Son, Yongin-si (KR); Woogeun Lee, Yongin-si (KR); Youngjae Jeon, Yongin-si (KR); Soojung Chae, Yongin-si (KR); Jiyun Hong, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 45 days.

(21) Appl. No.: 17/402,696

(22) Filed: Aug. 16, 2021

(65) Prior Publication Data

US 2022/0173198 A1   Jun. 2, 2022

(30) Foreign Application Priority Data

Nov. 30, 2020   (KR) .......................... 10-2020-0165064

(51) Int. Cl.
*H10K 59/131* (2023.01)
*G09G 3/3233* (2016.01)
(Continued)

(52) U.S. Cl.
CPC ....... *H10K 59/131* (2023.02); *H10K 59/1213* (2023.02); *H10K 59/1216* (2023.02);
(Continued)

(58) Field of Classification Search
CPC ............. H01L 27/3276; H01L 27/3262; H01L 27/3265; H01L 27/1225; H01L 27/124;
(Continued)

(56) References Cited

U.S. PATENT DOCUMENTS

| 8,269,937 B2 | 9/2012 | Lee |
| 8,796,768 B2 | 8/2014 | You |
| 9,064,755 B2 * | 6/2015 | Park ..................... H01L 27/1259 |
| 9,379,252 B2 | 6/2016 | Lee et al. |
| 2015/0091014 A1 * | 4/2015 | Hong ................... H01L 27/1248 438/158 |
| 2015/0092136 A1 * | 4/2015 | Kim .................. G02F 1/134363 438/30 |

(Continued)

FOREIGN PATENT DOCUMENTS

| KR | 10-1026982 | 4/2011 |
| KR | 10-2013-0009501 | 1/2013 |
| KR | 10-2013-0053053 | 5/2013 |

(Continued)

*Primary Examiner* — Matthew E. Gordon
*Assistant Examiner* — Sean Ayers Winters
(74) *Attorney, Agent, or Firm* — F. CHAU & ASSOCIATES, LLC

(57) ABSTRACT

A display apparatus includes a substrate including a display area and a peripheral area outside the display area, a thin film transistor arranged on the substrate corresponding to the display area and including a semiconductor layer and a gate electrode, a pad electrode arranged on the substrate corresponding to the peripheral area and including a material the same as that of the semiconductor layer, and a first insulating layer arranged on the thin film transistor and the pad electrode and including an opening that partially exposes the pad electrode. Accordingly, failure to perform a normal operation by a pixel circuit and a light-emitting element may be prevented.

15 Claims, 14 Drawing Sheets

(51) Int. Cl.
  *H01L 27/12*  (2006.01)
  *H01L 29/24*  (2006.01)
  *H01L 29/786*  (2006.01)
  *H10K 59/121*  (2023.01)

(52) U.S. Cl.
  CPC .............. *G09G 3/3233* (2013.01); *G09G 2300/0809* (2013.01); *H01L 27/1225* (2013.01); *H01L 27/124* (2013.01); *H01L 27/1255* (2013.01); *H01L 29/24* (2013.01); *H01L 29/7869* (2013.01)

(58) Field of Classification Search
  CPC .............. H01L 27/1255; H01L 29/24; H01L 29/7869; G09G 3/3233; G09G 2300/0809
  See application file for complete search history.

(56) References Cited

U.S. PATENT DOCUMENTS

| | | | | |
|---|---|---|---|---|
| 2016/0147124 | A1* | 5/2016 | Su .............. | G02F 1/133512 257/72 |
| 2018/0123078 | A1* | 5/2018 | Byun .............. | H10K 59/1213 |
| 2019/0172884 | A1* | 6/2019 | Shim .............. | H10K 59/123 |
| 2019/0326560 | A1* | 10/2019 | Cha .............. | H01L 21/308 |

FOREIGN PATENT DOCUMENTS

| | | |
|---|---|---|
| KR | 10-2016-0075966 | 6/2016 |
| KR | 10-2016-0141315 | 12/2016 |
| KR | 10-2018-0052912 | 5/2018 |
| KR | 10-2019-0075443 | 7/2019 |
| KR | 10-2092034 | 3/2020 |

* cited by examiner

DISPLAY APPARATUS WITH EXPOSED PAD ELECTRODE

CROSS-REFERENCE TO RELATED APPLICATION

This application claims priority under 35 U.S.C. § 119 to Korean Patent Application No. 10-2020-0165064, filed on Nov. 30, 2020, in the Korean Intellectual Property Office, the disclosure of which is incorporated by reference herein in its entirety.

TECHNICAL FIELD

The present disclosure relates to display apparatuses.

DISCUSSION OF RELATED ART

Display apparatuses are used for visually displaying image data. For example, a display apparatus may be used as a display for small products such as mobile phones or a display for large products such as televisions.

A display apparatus usually includes a substrate partitioned into a display area and a non-display area, and gate lines and data lines crossing each other and insulated from each other are formed in the display area. A plurality of pixel regions are defined in the display area, and a plurality of pixels disposed in the pixel regions receive electrical signals through the gate lines and data lines and emit light to display an image to the outside. Each of the pixel regions is provided with a thin film transistor and a pixel electrode electrically connected to the thin film transistor, and the plurality of pixel regions are commonly provided with a counter electrode. In the non-display area, various wirings that transmit electrical signals to the pixels in the display area, a gate driver, pads to which the data driver and a control unit can be connected, and the like, may be provided.

The display apparatuses have currently been used for various purposes, and as the thickness and weight of display apparatuses decrease, the range of use thereof is further expanding. Recently, with the diversified use of the display apparatuses, various designs to enhance the quality of the display apparatuses have been implemented.

SUMMARY

The present disclosure provides display apparatuses capable of preventing failure to perform a normal operation by a pixel circuit and a light-emitting element. However, the presented embodiments are merely exemplary, and the scope of the present disclosure is not limited thereto.

Additional aspects will be set forth in part in the description which follows and, in part, will be apparent from the description, or may be learned by practice of the presented embodiments of the present disclosure.

According to an embodiment of the present disclosure, a display apparatus includes a substrate including a display area and a peripheral area outside the display area, a thin film transistor arranged on the substrate corresponding to the display area and including a semiconductor layer and a gate electrode, a pad electrode arranged on the substrate corresponding to the peripheral area and including a material the same as that of the semiconductor layer, and a first insulating layer arranged on the thin film transistor and the pad electrode and including an opening that partially exposes the pad electrode.

According to an embodiment of the present disclosure, the pad electrode may include a first portion corresponding to the opening and a second portion outside the first portion, and a thickness of the first portion is smaller than a thickness of the second portion.

According to an embodiment of the present disclosure, the thickness of the second portion may be the same as a thickness of the semiconductor layer.

According to an embodiment of the present disclosure, the pad electrode may include a first portion corresponding to the opening and a second portion outside the first portion, and a thickness of the second portion may be greater than a thickness of the semiconductor layer.

According to an embodiment of the present disclosure, a thickness of the first portion may be the same as the thickness of the semiconductor layer.

According to an embodiment of the present disclosure, the pad electrode may have a multilayer structure.

According to an embodiment of the present disclosure, the pad electrode may include a first layer and a second layer different from the first layer.

According to an embodiment of the present disclosure, the second layer may be arranged on the first layer and may include a crystalline material.

According to an embodiment of the present disclosure, the pad electrode may include an oxide semiconductor material.

According to an embodiment of the present disclosure, at least a part of the pad electrode may be conductive.

According to an embodiment of the present disclosure, the display apparatus may further include a first pad connection electrode that includes a material the same as that of the gate electrode, is arranged on the pad electrode, and partially contacts the pad electrode.

According to an embodiment of the present disclosure, the display apparatus may further include a second insulating layer that is provided between the pad electrode and the first pad connection electrode and covers one end of the pad electrode, in which a side surface of the second insulating layer overlapping the pad electrode is surrounded by the first pad connection electrode.

According to an embodiment of the present disclosure, the display apparatus may further include a second pad connection electrode that is arranged under the pad electrode and is electrically connected to the first pad connection electrode.

According to an embodiment of the present disclosure, the display apparatus may further include a gate insulating layer that includes a first gate insulating layer provided between the semiconductor layer and the gate electrode and overlapping the gate electrode, and a second gate insulating layer covering an end of the semiconductor layer, an electrode layer that is arranged on the second gate insulating layer and partially contacts the semiconductor layer, a buffer layer that is arranged under the semiconductor layer, and a metal layer that is spaced apart from the semiconductor layer with the buffer layer interposed therebetween, in which the electrode layer and the metal layer are connected to each other through a contact hole that is defined in the buffer layer and the second gate insulating layer.

According to an embodiment of the present disclosure, the semiconductor layer may have a hole that partially exposes the buffer layer.

According to an embodiment of the present disclosure, the display apparatus may further include a storage capacitor that includes a lower electrode located on a layer the same as that of the metal layer and an upper electrode located on a layer the same as that of the semiconductor layer.

According to an embodiment of the present disclosure, a display apparatus includes a substrate including a display area and a peripheral area outside the display area, a semiconductor layer arranged on the substrate corresponding to the display area, a gate insulating layer arranged on the semiconductor layer, a gate electrode arranged on the gate insulating layer, partially overlapping the semiconductor layer, forming a thin film transistor together with the semiconductor layer and the gate insulating layer, and including a lower gate electrode and an upper gate electrode, a pad electrode arranged on the substrate corresponding to the peripheral area and including a material the same as that of the lower gate electrode, a first pad connection electrode arranged on the pad electrode, including a material the same as that of the upper gate electrode, and partially contacting an upper surface of the pad electrode, and a first insulating layer arranged on the thin film transistor and the pad electrode and including an opening that partially exposes the pad electrode.

According to an embodiment of the present disclosure, the pad electrode may include a first portion corresponding to the opening and a second portion outside the first portion, and a thickness of the first portion may be smaller than a thickness of the second portion.

According to an embodiment of the present disclosure, a thickness of the second portion may be the same as a thickness of the lower gate electrode.

According to an embodiment of the present disclosure, the display apparatus may further include a second pad connection electrode that is arranged under the pad electrode and is electrically connected to the first pad connection electrode and the pad electrode.

According to an embodiment of the present disclosure, the gate insulating layer may include a first gate insulating layer overlapping the gate electrode and a second gate insulating layer covering an end of the semiconductor layer.

According to an embodiment of the present disclosure, the semiconductor layer may include an oxide semiconductor material, and a portion of the semiconductor layer, which is exposed by the gate insulating layer, may be conductive.

According to an embodiment of the present disclosure, the display apparatus may further include an electrode layer arranged on the second gate insulating layer and partially contacting the semiconductor layer, a buffer layer arranged under the semiconductor layer, and a metal layer spaced apart from the semiconductor layer with the buffer layer interposed therebetween, in which the electrode layer and the metal layer are connected to each other through a contact hole defined in the buffer layer and the second gate insulating layer.

According to an embodiment of the present disclosure, the semiconductor layer may have a hole that partially exposes the buffer layer.

According to an embodiment of the present disclosure, a display apparatus includes a substrate including a display area and a peripheral area outside the display area, a thin film transistor arranged on the substrate corresponding to the display area and including a semiconductor layer and a gate electrode, a pad electrode arranged on the substrate corresponding to the peripheral area, a pad connection electrode arranged on the pad electrode and partially contacting the pad electrode, and a first insulating layer arranged on the thin film transistor and the pad connection electrode, having an opening partially exposing the pad electrode, and directly contacting an upper surface and a side surface of the pad connection electrode and surrounding the pad connection electrode.

According to an embodiment of the present disclosure, the pad connection electrode may include copper (Cu).

According to an embodiment of the present disclosure, the pad electrode may include a first portion corresponding to the opening and a second portion outside the first portion, and a thickness of the first portion may be smaller than a thickness of the second portion.

According to an embodiment of the present disclosure, a display apparatus includes a substrate including a display area and a peripheral area outside the display area, a thin film transistor arranged on the substrate corresponding to the display area and including a semiconductor layer and a gate electrode, the semiconductor layer including an oxide semiconductor material, a pad electrode arranged on the substrate corresponding to the peripheral area and including a material the same as the oxide semiconductor material of the semiconductor layer, and an insulating layer arranged on the thin film transistor and the pad electrode and partially exposing the pad electrode, in which a portion of the pad electrode exposed by the insulating layer has a thickness the same as or smaller than a thickness of the semiconductor layer.

According to an embodiment of the present disclosure, the oxide semiconductor material may include indium tin gallium oxide (ITGO) or indium tin oxide (ITO).

The general and specific aspects may be implemented by using a system, a method, a computer program, or a combination of a system, a method, and a computer program.

BRIEF DESCRIPTION OF THE DRAWINGS

The above and other features of the present disclosure will be more apparent from the following description taken in conjunction with the accompanying drawings, in which.

Figure 1:
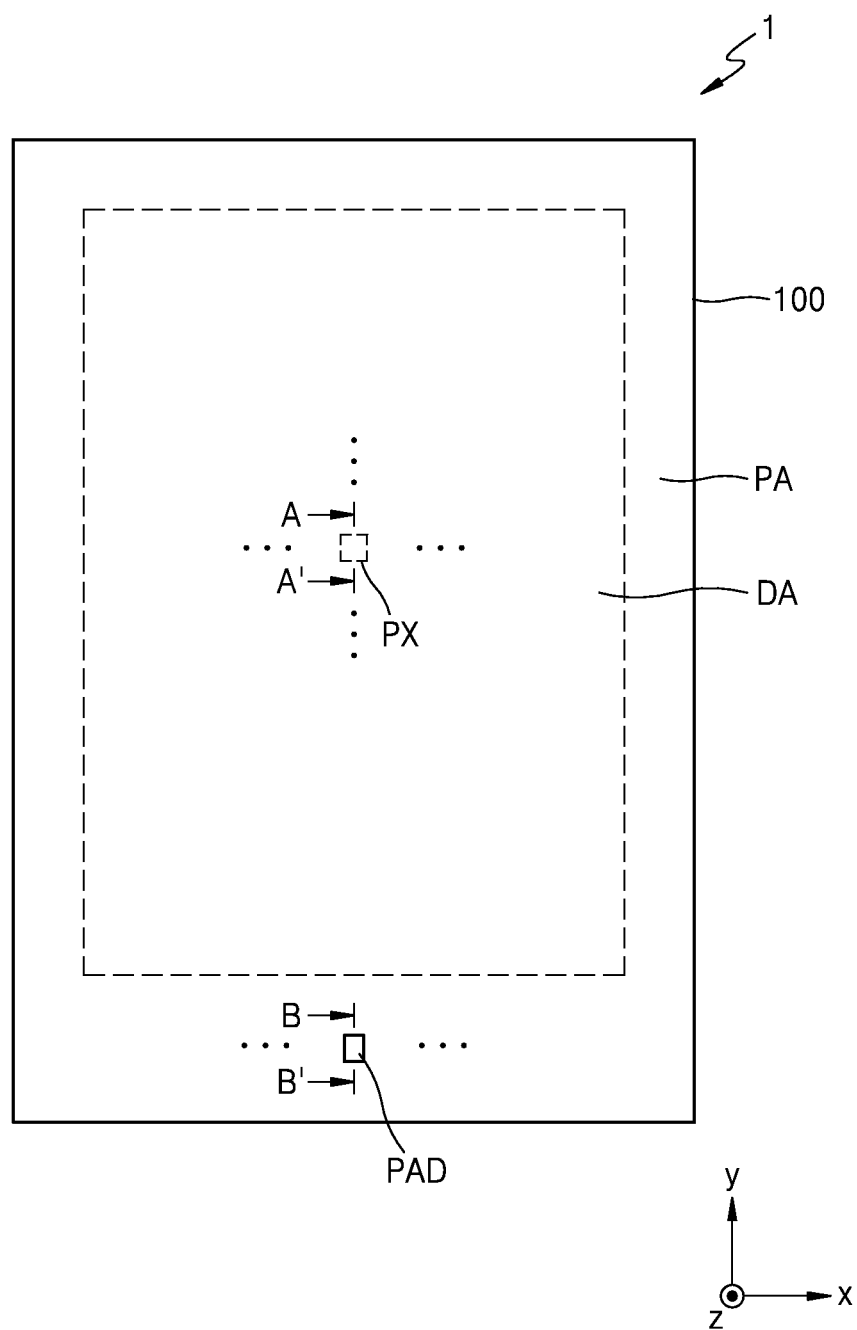
FIG. 1 is a schematic plan view of a display apparatus according to an embodiment of the present disclosure.

Since the drawings in FIGS. 1-12 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present disclosure. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, embodiments will be illustrated in the drawings and described in detail in the written description. Features of the present disclosure and methods of accomplishing the same may be understood more readily with reference to the following detailed description of embodiments and the accompanying drawings. However, this is not intended to limit the disclosure to particular modes of practice, and it is to be appreciated that all changes, equivalents, and substitutes that do not depart from the spirit and scope of the present disclosure are encompassed in the present disclosure.

In the description of the present disclosure, certain detailed explanations of the related art are omitted when it is deemed that they may unnecessarily obscure the essence of the disclosure.

In the following embodiments, while such terms as "first", "second", etc., may be used to describe various components, such components must not be limited to the above terms. The above terms are used only to distinguish one component from another. Thus, a first component discussed below could be termed a second component, and vice versa, without departing from the teachings of the present disclosure.

In the following embodiments, the singular forms "a", "an" and "the" are intended to include the plural forms as well, unless the context clearly indicates otherwise.

In the following embodiments, it will be further understood that the terms "comprises" and/or "comprising" used herein specify the presence of stated features or components, but do not preclude the presence or addition of one or more other features or components.

When the term "about" is used in this specification in connection with a numerical value, it is intended that the associated numerical value includes a tolerance of up to ±10% around the stated numerical value.

In the following embodiments, it will be understood that when a layer, region, or component is referred to as being "formed on" another layer, region, or component, it can be directly or indirectly formed on the other layer, region, or component. That is, for example, intervening layers, regions, or components may be present.

When a certain embodiment may be implemented differently, a specific process order may be performed differently from the described order. For example, two consecutively described processes may be performed substantially at the same time or performed in an order opposite to the described order.

In the specification, the expression such as "A and/or B" may include A, B, or A and B. The expression such as "at least one of A and B" may include A, B, or A and B.

In the following embodiments, it will be understood that when a component, such as a layer, a film, a region, or a plate, is referred to as being "on" another component, the component can be directly on the other component or intervening components may be present thereon. For example, in the specification, when a layer, region, or component is referred to as being electrically connected to another layer, region, or component, it can be directly electrically connected to the other layer, region, or component or indirectly electrically connected to the other layer, region, or component through intervening layers, regions, or components.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a schematic plan view of a display apparatus 1 according to an embodiment of the present disclosure.

Referring to FIG. 1, the display apparatus 1 may include a display area DA for displaying an image and a peripheral area PA disposed around the display area DA. The display apparatus 1 may provide an image to the outside by using light emitted from the display area DA. As the display apparatus 1 includes a substrate 100, it may be said that the substrate 100 includes the display area DA and the peripheral area PA.

The substrate 100 may include various materials such as, for example, glass, metal, or plastic. According to an embodiment of the present disclosure, the substrate 100 may include a flexible material. The flexible material may refer to a substrate that is flexible, and easily bendable, foldable, or rollable. The substrate 100 including such a flexible material may include, for example, ultrathin type glass, metal, or plastic. In an embodiment of the present disclosure, the plastic material included in the substrate 100 may be polyimide.

A plurality of pixels PX having various display elements such as an organic light-emitting diode OLED may be arranged in the display area DA of the substrate 100. The pixels PX are arranged in various forms such as, for example, a stripe arrangement, a pentile arrangement, a mosaic arrangement, and the like, to implement an image.

When the display area DA is assumed to have a plane shape, the display area DA may have a rectangular shape as illustrated in FIG. 1. For example, the display area DA may have a rectangular shape, and may have short sides in a first direction (x-axis direction) and long sides in a second direction (y-axis direction). The corner where the short side in the first direction (x-axis direction) meets the long side in the second direction (y-axis direction) may be formed to have a round shape with a predetermined curvature or have a right-angled shape. In an embodiment of the present disclosure, the display area DA may have a polygonal shape such as, for example, a triangle, a pentagon, a hexagon, and the like, a circular shape, an oval shape, an amorphous shape, and the like.

The peripheral area PA of the substrate 100 is arranged around the display area DA and may be an area where no image is displayed. For example, the pixels PX are not arranged in the peripheral area PA of the substrate 100. The peripheral area PA may entirely or partially surround the display area DA. Various wirings for transmitting electrical signals to the display area DA, or a pad portion PAD on which a printed circuit board or a driver IC chip is attached, may be located in the peripheral area PA.

Figure 2:
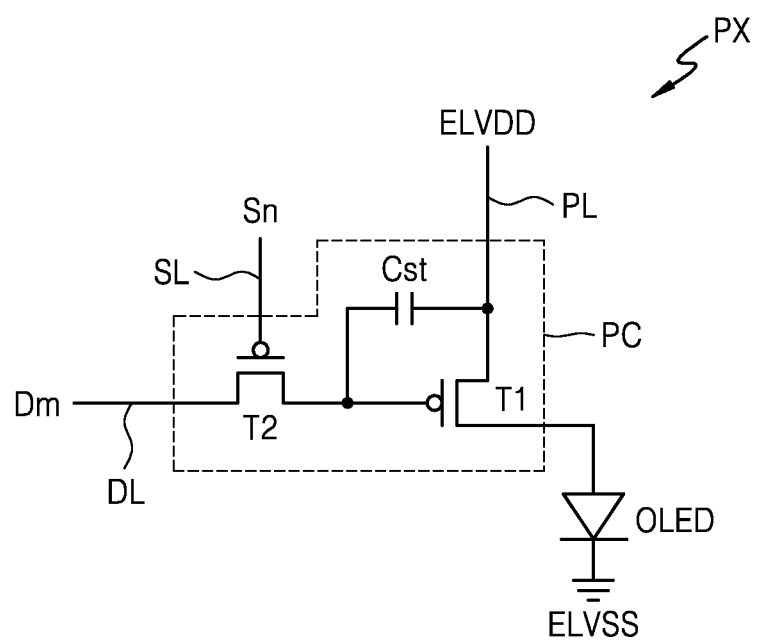
FIG. 2 is a schematic equivalent circuit diagram of a pixel of a display apparatus according to an embodiment of the present disclosure.

FIG. 2 is a schematic equivalent circuit diagram of a pixel of a display apparatus according to an embodiment of the present disclosure.

Referring to FIG. 2, each pixel PX may include a pixel circuit PC connected to a scan line SL and a data line DL, and an organic light-emitting diode OLED connected to the pixel circuit PC.

The pixel circuit PC for driving the organic light-emitting diode OLED may include a driving thin film transistor (TFT) T1, a switching TFT T2, and a storage capacitor Cst. The organic light-emitting diode OLED may generate light in response to electrical signals transmitted from the driving TFT T1 and the switching TFT T2. The switching TFT T2 is connected to the scan line SL and the data line DL, and transmits, to the driving TFT T1, a data signal Dm input through the data line DL in response to a scan signal Sn input through the scan line SL.

The storage capacitor Cst is connected to the switching TFT T2 and a driving voltage line PL, and store a voltage corresponding to a difference between a voltage received from the switching TFT T2 and a driving voltage ELVDD supplied through the driving voltage line PL. A common voltage ELVSS may be supplied to a counter electrode of the organic light-emitting diode OLED.

The driving TFT T1 is connected to the driving voltage line PL and the storage capacitor Cst, and may control a driving current flowing in the organic light-emitting diode OLED from the driving voltage line PL corresponding to a voltage value stored in the storage capacitor Cst. The organic light-emitting diode OLED may emit light having a certain luminance by the driving current. For example, the organic light-emitting diode OLED may emit light using the driving voltage ELVDD (positive output) and the common voltage ELVSS (negative output), and here, an intensity of the light emitted from the organic light-emitting diode OLED may be determined by an amount of charges stored in the storage capacitor Cst.

Although FIG. 2 illustrates a case in which the pixel circuit PC includes two TFTs and one storage capacitor, the present disclosure is not limited thereto. The number of TFTs and the number of storage capacitors may be changed in various ways according to a design of the pixel circuit PC.

For example, the pixel circuit PC may include three or more TFTs and/or two or more storage capacitors. In an embodiment of the present disclosure, the pixel circuit PC may include three TFTs and two or three storage capacitors. In an embodiment of the present disclosure, the pixel circuit PC may include seven TFTs and one storage capacitor.

Figure 3:
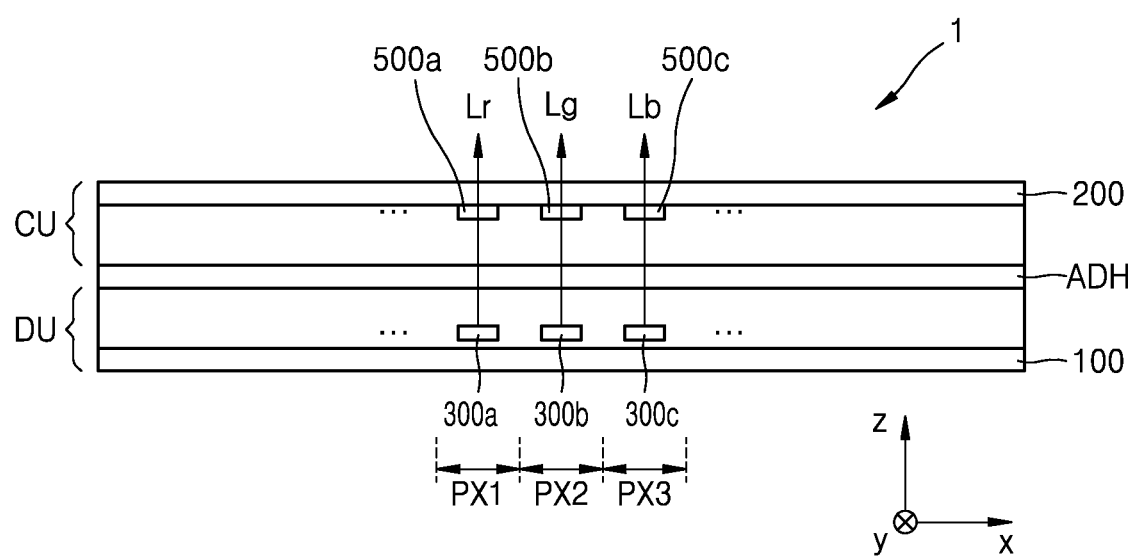
FIG. 3 is a schematic cross-sectional view of a display apparatus according to an embodiment of the present disclosure.

FIG. 3 is a schematic cross-sectional view of a display apparatus according to an embodiment of the present disclosure.

Referring to FIG. 3, the display apparatus 1 may include a display unit DU and a color filter unit CU arranged to face the display unit DU. The display unit DU may include a first pixel PX1, a second pixel PX2, and a third pixel PX3, which are arranged on the substrate 100 (hereinafter, referred to as the lower substrate). The first pixel PX1, the second pixel PX2, and the third pixel PX3 may be pixels emitting different colors on the lower substrate 100. For example, the first pixel PX1 may emit red light Lr, the second pixel PX2 may emit green light Lg, and the third pixel PX3 may emit blue light Lb.

The first pixel PX1, the second pixel PX2, and the third pixel PX3 may respectively include a first light-emitting element 300a, a second light-emitting element 300b, and a third light-emitting element 300c, each including the organic light-emitting diode OLED. In an embodiment of the present disclosure, the first light-emitting element 300a, the second light-emitting element 300b, and the third light-emitting element 300c may emit blue light. In other words, the first to third light-emitting elements 300a, 300b and 300c all generate light rays of the same color. In an embodiment of the present disclosure, the first light-emitting element 300a, the second light-emitting element 300b and the third light-emitting element 300c may emit the red light Lr, the green light Lg, and the blue light Lb, respectively. In other words, the first to third light-emitting elements 300a, 300b and 300c may generate light rays with colors respectively corresponding to the colors emitted from the first to third pixels PX1, PX2, and PX3.

The color filter unit CU may include filter portions 500a, 500b, and 500c. Light rays emitted from the first light-emitting element 300a, the second light-emitting element 300b and the third light-emitting element 300c may respectively pass through the filter portions 500a, 500b, and 500c to be emitted as the red light Lr, the green light Lg, the blue light Lb.

The filter portions 500a, 500b, and 500c may be located directly on an upper substrate 200. The filter portions 500a, 500b, and 500c may respectively include a first quantum dot layer 220a and a first filter layer 210a, a second quantum dot layer 220b and a second filter layer 210b, a transparent layer 220c and a third filter layer 210c of FIG. 12, which are described below.

In this state, "being located directly on the upper substrate 200" may mean that the color filter unit CU is manufactured by forming the first filter layer 210a, the second filter layer 210b, and the third filter layer 210c directly on the upper substrate 200. Then, the display unit DU and the color filter unit CU may be bonded to each other with the first filter layer 210a, the second filter layer 210b, and the third filter layer 210c arranged to face the first pixel PX1, the second pixel PX2, and the third pixel PX3, respectively. Since, the first filter layer 210a, the second filter layer 210b, and the third filter layer 210c are arranged to face the first pixel PX1, the second pixel PX2, and the third pixel PX3, respectively, the first filter layer 210a, the second filter layer 210b, and the third filter layer 210c may then be located below the upper substrate 200. In many instances throughout the specification, the term "cover" or "on", may mean covering or on the side surface of the subject, or may mean covering or on the subject from below.

FIG. 3 illustrates that the display unit DU and the color filter unit CU are bonded to each other through an adhesive layer ADH. The adhesive layer ADH may include, for example, optical clear adhesive (OCA) and/or a pressure sensitive adhesive (PSA), but the present disclosure is not limited thereto. In an embodiment of the present disclosure, the adhesive layer ADH may be omitted.

Although FIG. 3 illustrates that the filter portions 500a, 500b, and 500c are arranged on the upper substrate 200, the present disclosure is not limited thereto. For example, the filter portions 500a, 500b, and 500c may be arranged on the display unit DU which is arranged on the lower substrate 100.

In an embodiment of the present disclosure, the filter portions 500a, 500b, and 500c may be arranged on a thin film encapsulation layer 400 of FIG. 12 that is described below. The first quantum dot layer 220a, the second quantum dot layer 220b, the transparent layer 220c, the first filter layer 210a, the second filter layer 210b, and the third filter layer 210c may be arranged on the thin film encapsulation layer 400. First, the first quantum dot layer 220a, the second quantum dot layer 220b, and the transparent layer 220c may be arranged on the thin film encapsulation layer 400, and then the first filter layer 210a, the second filter layer 210b, and the third filter layer 210c may be arranged on the first quantum dot layer 220a, the second quantum dot layer 220b, and the transparent layer 220c, respectively. The first filter layer 210a may include a red color filter for transmitting light of a red wavelength region. The second filter layer 210b may include a green color filter for transmitting light of a green wavelength region. The third filter layer 210c may include a blue color filter for transmitting light of a blue wavelength region.

The display apparatus 1, as illustrated in FIG. 3, may include the lower substrate 100 and the upper substrate 200. The number of substrates included in the display apparatus 1 may be two. In an embodiment of the present disclosure, the display apparatus 1 may not include the upper substrate 200, and may include the lower substrate 100 only. In this state, the filter portions 500a, 500b, and 500c may be arranged on the lower substrate 100. The number of substrates included in the display apparatus 1 may be one.

Figure 4A:
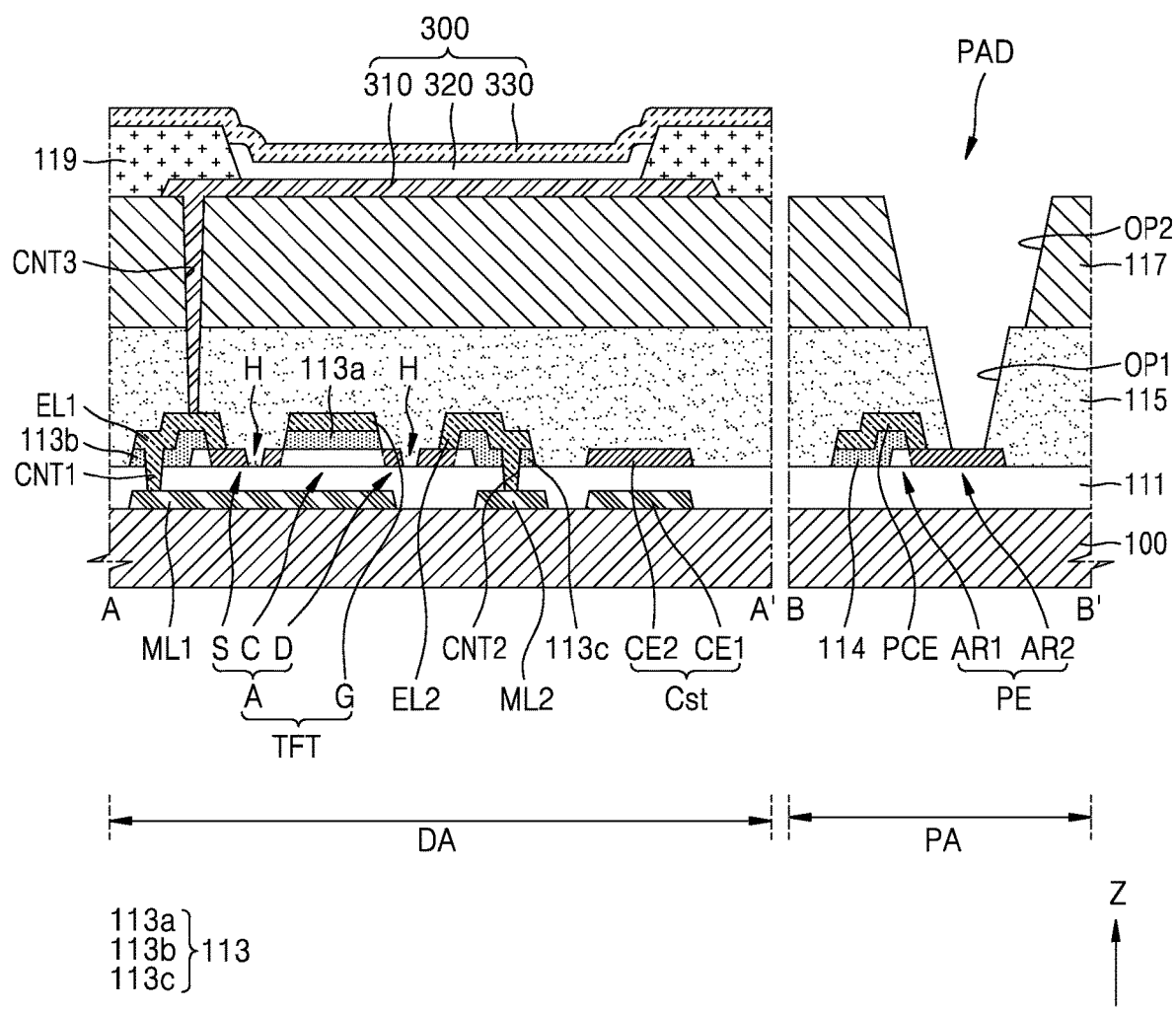
FIG. 4A is a cross-sectional view of a display area and a pad portion of FIG. 1 taken along lines A-A' and B-B', respectively, according to an embodiment of the present disclosure.
Figure 4B:
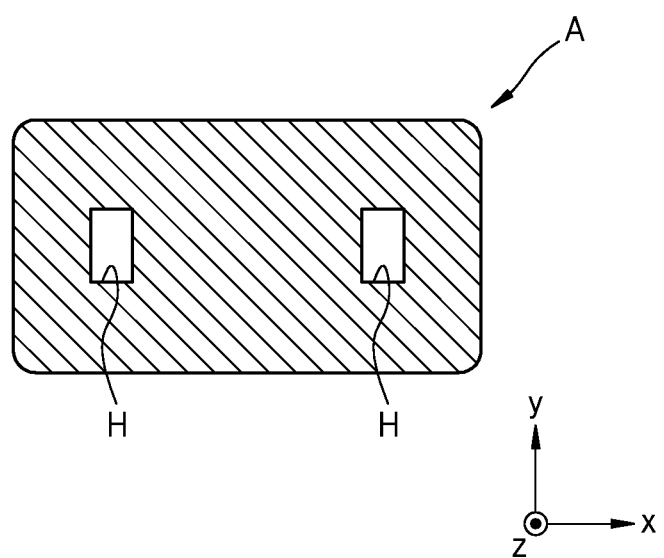
FIG. 4B is a schematic plan view of a semiconductor layer of FIG. 4A.
Figure 4C:
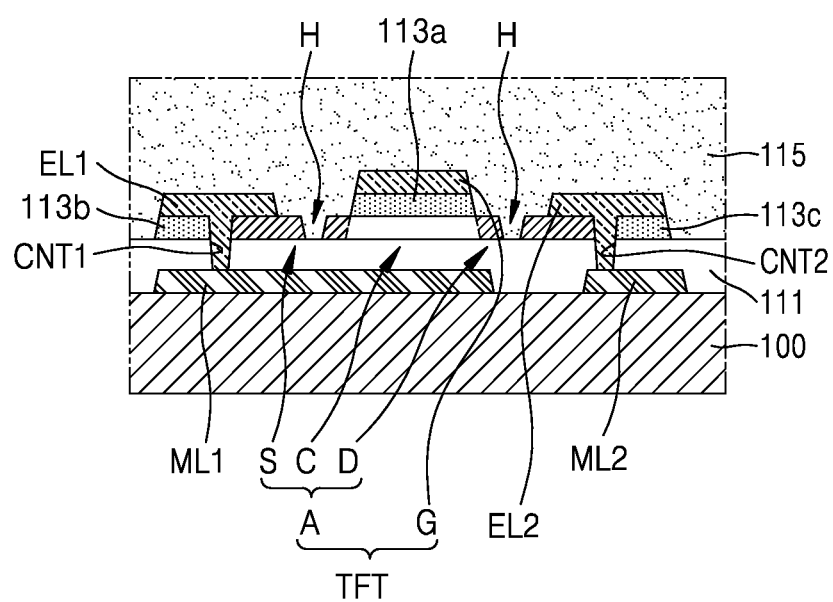
FIG. 4C is a schematic cross-sectional view of a thin film transistor of FIG. 4A according to an embodiment of the present disclosure.

FIG. 4A is a schematic cross-sectional view of a display apparatus according to an embodiment of the present disclosure. In detail, FIG. 4A is a cross-sectional view of the display area DA and the pad portion PAD of FIG. 1 taken along lines A-A' and B-B', respectively. FIG. 4B is a schematic plan view of a semiconductor layer A of FIG. 4A, and FIG. 4C is a schematic cross-sectional view of a thin film transistor TFT of FIG. 4A according to an embodiment of the present disclosure.

Referring to FIG. 4A, the display apparatus 1 (see FIG. 1) may include the thin film transistor TFT arranged on the substrate 100 corresponding to (or in) the display area DA and the pad portion PAD arranged on the substrate 100 corresponding to the peripheral area PA.

The thin film transistor TFT may include the semiconductor layer A and a gate electrode G, and the pad portion PAD may include a pad electrode PE and a pad connection electrode PCE. In an embodiment of the present disclosure, the pad electrode PE may include a material the same as that of the semiconductor layer A.

The display apparatus 1 may include a first insulating layer 115 arranged on the thin film transistor TFT and the pad portion PAD. The first insulating layer 115 may have a first opening OP1 that exposes a part of the pad electrode PE. Furthermore, the first insulating layer 115 may surround an upper surface and a side surface of the pad connection electrode PCE, and may directly contact the upper surface and the side surface of the pad connection electrode PCE.

The configuration of the display apparatus 1 is described in detail according to a stack structure with reference to FIG. 4A.

The substrate 100 may include, for example, a glass material, a ceramic material, a metal material, or a material having flexible or bendable characteristics. When the substrate 100 has flexible or bendable characteristics, the substrate 100 may include polymer resin such as, for example, polyethersulfone, polyacrylate, polyetherimide, polyethylene naphthalate, polyethylene terephthalate, polyphenylene sulfide, polyarylate, polyimide, polycarbonate or cellulose acetate propionate.

The substrate 100 may have a single layer or a multilayer structure of the material, and may further include an inorganic layer for a multilayer structure. In an embodiment of the present disclosure, the substrate 100 may have a structure of an organic material/an inorganic material/an organic material.

A buffer layer 111 may reduce or prevent intrusion of foreign materials, moisture, or external air from under the substrate 100, and may provide a planarized surface on the substrate 100. The buffer layer 111 may include, for example, an inorganic material such as an oxide or a nitride, an organic material, or an organic/inorganic complex, and may have a single layer or a multilayer structure of an inorganic material and an organic material. In an embodiment of the present disclosure, the first buffer layer 111 may be formed of an inorganic layer such as, for example, a silicon nitride ($SiN_x$) layer, a silicon oxynitride (SiON) layer, a silicon oxide ($SiO_2$) layer, a titanium oxide ($TiO_2$) layer, a tantalum oxide ($Ta_2O_5$) layer, a hafnium oxide ($HfO_2$) layer, or an aluminum oxide ($Al_2O_3$) layer.

A barrier layer may be further provided between the substrate 100 and the buffer layer 111. The barrier layer may prevent or reduce intrusion of impurities from the substrate 100, and the like, into the semiconductor layer A. The barrier layer may include, for example, an inorganic material such as an oxide or a nitride, an organic material, or an organic/inorganic complex, and may have a single layer or a multilayer structure of an inorganic material and an organic material.

The semiconductor layer A may be arranged on the buffer layer 111. The semiconductor layer A may include an oxide semiconductor material. The semiconductor layer A may include, for example, an oxide of at least one material of, for example, indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), or zinc (Zn).

In an embodiment of the present disclosure, the semiconductor layer A may include, for example, a zinc oxide (ZnO) semiconductor layer, a zinc tin oxide (ZTO) semiconductor layer, a zinc indium oxide (ZIO) semiconductor layer, an indium oxide ($In_2O_3$) semiconductor layer, a titanium oxide ($TiO_2$) semiconductor layer, an indium tin zinc oxide (ITZO) semiconductor layer, an indium gallium zinc oxide (IGZO) semiconductor layer, an indium tin gallium oxide (ITGO) semiconductor layer, or the like. For the oxide semiconductor including two or more metals, there is no limitation on the metal composition ratio of these metals. For example, IGZO, may mean an oxide semiconductor containing indium (In), gallium (Ga), and zinc (Zn), and there is no limitation on the composition ratio thereof. As an oxide semiconductor has a wide bandgap of about 3.1 eV, a high carrier mobility, and a low leakage current, even when a driving time is long, voltage drop is not so great that luminance does not change much due to the voltage drop during low frequency driving.

The semiconductor layer A may include a channel region C, and a source region S and a drain region D respectively located at one side and the other side of the channel region C. The semiconductor layer A may include a single layer.

A first metal layer ML1, a second metal layer ML2, and a lower electrode CE1 of the storage capacitor Cst may be arranged between the substrate 100 and the buffer layer 111. The first metal layer ML1, the second metal layer ML2, and the lower electrode CE1 of the storage capacitor Cst may each include a conductive material including, for example, molybdenum (Mo), aluminum (Al), copper (Cu), titanium (Ti), or the like, and may be formed in a multilayer or a single layer including the above material. In an embodiment of the present disclosure, the first metal layer ML1, the second metal layer ML2, and the lower electrode CE1 of the storage capacitor Cst may have a multilayer structure, for example, a tri-layer structure, of Ti/Al/Ti. The first metal layer ML1 and the second metal layer ML2 may each be a source electrode, a drain electrode, a data line, or the like.

In an embodiment of the present disclosure, the first metal layer ML1 may be arranged to overlap with the semiconductor layer A including an oxide semiconductor material. Throughout the specification, the word "overlap" means overlapping in a third direction (z-axis direction) perpendicular to a top surface of the substrate 100. The first metal layer ML1 may be arranged to overlap with the channel region C of the semiconductor layer A. As the semiconductor layer A includes an oxide semiconductor material that is characteristically weak to light, the first metal layer ML1 may prevent a change of the device characteristics of the thin film transistor TFT including an oxide semiconductor material due to photocurrent that is induced in the semiconductor layer A by external light input from the substrate 100. For example, the first metal layer ML1 may be opaque and may block external light transmitted through the substrate 100 from reaching the channel region C of the semiconductor layer A.

The first metal layer ML1 may be connected to the semiconductor layer A. The first metal layer ML1, as illustrated in FIG. 4A, may be connected to the source region S of the semiconductor layer A. In an embodiment of the present disclosure, the first metal layer ML1 may be connected to the drain region D of the semiconductor layer A. The first metal layer ML1 is connected to the semiconductor layer A so that the voltage of the first metal layer ML1 may be uniformly maintained not to be floating. Accordingly, during driving of a pixel circuit, occurrence of an unexpected result value according to a floating state of the voltage of the first metal layer ML1 may be prevented.

In an embodiment of the present disclosure, an upper electrode CE2 of the storage capacitor Cst and the pad electrode PE may be arranged on the buffer layer 111. The upper electrode CE2 of the storage capacitor Cst and the pad electrode PE may each include a material the same as that of the semiconductor layer A.

In an embodiment of the present disclosure, the upper electrode CE2 of the storage capacitor Cst and the pad electrode PE may each include an oxide semiconductor material. The upper electrode CE2 of the storage capacitor Cst and the pad electrode PE may each include, for example, an oxide of at least one material of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), or zinc (Zn). In an embodiment of the present disclosure, the upper electrode CE2 of the storage capacitor Cst and the pad electrode PE may each include, for example, zinc oxide (ZnO), zinc tin oxide (ZTO), zinc indium oxide (ZIO), indium oxide ($In_2O_3$), titanium oxide ($TiO_2$), indium tin zinc oxide (ITZO), indium gallium zinc oxide (IGZO), indium tin gallium oxide (ITGO), or the like. For the oxide semiconductor including two or more metals, there is no limitation on the metal composition ratio of these metals. For example, ITGO, may mean an oxide semiconductor containing indium (In), tin (Sn), and gallium (Ga), and there is no limitation on the composition ratio thereof.

When the pad electrode PE includes indium tin gallium oxide (ITGO), as indium tin gallium oxide (ITGO) may be easily crystalized by a subsequent heat treatment, and the like, the pad electrode PE may be protected in an etching process performed after the pad electrode PE is formed.

The upper electrode CE2 of the storage capacitor Cst overlaps with the lower electrode CE1 with the buffer layer 111 interposed therebetween, thereby forming capacitance. In this case, the buffer layer 111 may function as a dielectric layer of the storage capacitor Cst.

In an embodiment of the present disclosure, the storage capacitor Cst may include the lower electrode CE1 and the upper electrode CE2, and as illustrated in FIG. 4A, may be provided separately, not overlapping with the thin film transistor TFT. However, the present disclosure is not limited thereto. For example, unlike the above, the storage capacitor Cst may overlap with the thin film transistor TFT. In an embodiment of the present disclosure, the gate electrode G of the thin film transistor TFT may function as the lower electrode CE1 of the storage capacitor Cst.

A gate insulating layer 113 may be arranged as an insulating layer on the semiconductor layer A. The gate insulating layer 113 may include, for example, a silicon oxide ($SiO_2$) layer, a silicon nitride ($SiN_x$) layer, a silicon oxynitride (SiON) layer, an aluminum oxide ($Al_2O_3$) layer, a titanium oxide ($TiO_2$) layer, a tantalum oxide ($Ta_2O_5$) layer, a hafnium oxide ($HfO_2$) layer, a zinc oxide ($ZnO_2$) layer, or the like.

As illustrated in FIG. 4A, the gate insulating layer 113 may be patterned to overlap with a part of the semiconductor layer A. The gate insulating layer 113 may be patterned to partially expose the source region S and the drain region D.

The gate insulating layer 113 may include a first gate insulating layer 113a, a second gate insulating layer 113b, and a third gate insulating layer 113c. The first gate insulating layer 113a may overlap with the channel region C, the second gate insulating layer 113b may overlap with a part of the source region S, and the third gate insulating layer 113c may overlap with a part of the drain region D. The first gate insulating layer 113a may overlap with the gate electrode G that is described below. The second gate insulating layer 113b and the third gate insulating layer 113c may cover both ends of the semiconductor layer A, respectively.

The source region S and the drain region D may undergo a metallization process such as plasma processing, or the like. In this state, a portion of the semiconductor layer A overlapping with the gate insulating layer 113 is not exposed to the plasma processing, and thus may have different characteristics from an area that is exposed to the plasma processing. When the semiconductor layer A is plasma-processed, by using the gate insulating layer 113 as a self-alignment mask, a plurality of regions having different characteristics may be formed in the semiconductor layer A. The regions may be classified according to the exposure during the plasma processing.

As illustrated in FIG. 4A, the channel region C that is not plasma-processed is formed in the semiconductor layer A at a position overlapping with the first gate insulating layer 113a, and the source region S and the drain region D that are plasma-processed may be formed at both sides of the channel region C. As a part of the source region S may overlap with the second gate insulating layer 113b, the part of the source region S may not be plasma-processed due to being covered by the second gate insulating layer 113b. Furthermore, as a part of the drain region D may overlap with the third gate insulating layer 113c, the part of the drain region D may not be plasma-processed due to being covered by the third gate insulating layer 113c. The part of the source region S and the part of the drain region D that are plasma-processed may be conductive. For example, when the semiconductor layer A is an n-type semiconductor, the part of the source region S and the part of the drain region D may each become n+. In an embodiment of the present disclosure, the semiconductor layer A may include an oxide semiconductor material, and a portion of the semiconductor layer A, which is exposed by the first gate insulating layer 113a (i.e., not overlapped by the first gate insulating layer 113a), may be plasma-processed, and thus, may be conductive.

Although FIG. 4A illustrates that the gate insulating layer 113 is patterned, the present disclosure is not limited thereto. For example, the gate insulating layer 113 may be arranged on the entire surface of the substrate 100 to cover the upper surface and the side surface of the semiconductor layer A.

A pad insulating layer 114 may be arranged on the pad electrode PE as an insulating layer. The pad insulating layer 114 may include, for example, a silicon oxide (SiO$_2$) layer, a silicon nitride (SiN$_x$) layer, a silicon oxynitride (SiON) layer, an aluminum oxide (Al$_2$O$_3$) layer, a titanium oxide (TiO$_2$) layer, a tantalum oxide (Ta$_2$O$_5$) layer, a hafnium oxide (HfO$_2$) layer, a zinc oxide (ZnO$_2$) layer, or the like.

As illustrated in FIG. 4A, the pad insulating layer 114 may be patterned to overlap with a part of the pad electrode PE. The pad insulating layer 114 may cover one end of the pad electrode PE.

The pad electrode PE may undergo a metallization process such as plasma processing, or the like. In this state, as a portion of the pad electrode PE that overlaps with the pad insulating layer 114 is not exposed to the plasma processing, the portion may have different characteristics from an area that is exposed to the plasma processing. When the pad electrode PE is plasma-processed, by using the pad insulating layer 114 as a self-alignment mask, a plurality of regions having different characteristics may be formed in the pad electrode PE. The regions may be classified according to the exposure during the plasma processing.

As illustrated in FIG. 4A, a first region AR1 that is not plasma-processed and a second region AR2 that is plasma-processed may be formed in the pad electrode PE at a position overlapping with the pad insulating layer 114 and at a positon other than the first region AR1, respectively. The second region AR2 that is plasma-processed may be conductive. For example, the second region AR2 of the pad electrode PE, which is exposed by the pad insulating layer 114 (i.e., not overlapped by the pad insulating layer 114), may be plasma-processed, and thus, may be conductive. In an embodiment of the present disclosure, the second region AR2 that is plasma-processed may become n+. Likewise, at least a part of the pad electrode PE may be metallized, and thus, may be conductive.

Although FIG. 4A illustrates that the pad insulating layer 114 is patterned, the present disclosure is not limited thereto. For example, in an embodiment of the present disclosure, the pad insulating layer 114 may be arranged on the entire surface of the substrate 100 to cover the upper surface and the side surface of the pad electrode PE.

The gate electrode G may be arranged on the gate insulating layer 113 to at least partially overlap with the semiconductor layer A. The semiconductor layer A may be electrically insulated from the gate electrode G by the gate insulating layer 113. Furthermore, a first electrode layer EL1 electrically connected to the source region S and a second electrode layer EL2 electrically connected to the drain region D may be arranged on the gate insulating layer 113. The gate electrode G, the first electrode layer EL1, and the second electrode layer EL2 may each be formed in a single layer or a multilayer, and may include one or more metal selected from among, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

The gate electrode G, the first electrode layer EL1, and the second electrode layer EL2 may be simultaneously formed by patterning a preliminary metal layer. The gate electrode G may overlap with the first gate insulating layer 113a, the first electrode layer EL1 may overlap with the second gate insulating layer 113b, and the second electrode layer EL2 may overlap with the third gate insulating layer 113c. The first electrode layer EL1 may surround one side surface of the second gate insulating layer 113b, and the second electrode layer EL2 may surround one side surface of the third gate insulating layer 113c.

Although FIG. 4A illustrates that a part of the second gate insulating layer 113b is provided between the first electrode layer EL1 and the semiconductor layer A, the present disclosure is not limited thereto. For example, in an embodiment of the present disclosure, as illustrated in FIG. 4C, the part of the second gate insulating layer 113b provided between the first electrode layer EL1 and the semiconductor layer A may be omitted. As the part of the second gate insulating layer 113b is omitted, an area between the first electrode layer EL1 and the semiconductor layer A that are in direct contact with each other may be increased. Also, as an entire source region S may not be overlapped by the second gate insulating layer 113b, the entire source region S may be plasma-processed, and thus, may be conductive.

Although the above description is presented based on the first electrode layer EL1, the description may be identically applied to the second electrode layer EL2. In other words, as illustrated in FIG. 4C, a part of the third gate insulating layer 113c provided between the second electrode layer EL2 and the semiconductor layer A may be omitted. As the part of the third gate insulating layer 113c is omitted, an area between the second electrode layer EL2 and the semiconductor layer A that are in direct contact with each other may be increased. Also, as an entire drain region D may not be overlapped by the third gate insulating layer 113c, the entire drain region D may be plasma-processed, and thus, may be conductive.

The first electrode layer EL1 may be connected to the first metal layer ML1 through a first contact hole CNT1 that is defined in the second gate insulating layer 113b and the buffer layer 111. As the first electrode layer EL1 may be connected to the semiconductor layer A, the semiconductor layer A and the first metal layer ML1 may be connected to each other through the first electrode layer EL1. The first electrode layer EL1 may function as a bridge that connects the first metal layer ML1 to the semiconductor layer A.

The second electrode layer EL2 may be connected to the second metal layer ML2 through a second contact hole CNT2 that is defined in the third gate insulating layer 113c and the buffer layer 111. As the second electrode layer EL2 may be connected to the semiconductor layer A, the semiconductor layer A and the second metal layer ML2 may be connected to each other through the second electrode layer EL2. The second electrode layer EL2 may function as a bridge that connects the second metal layer ML2 to the semiconductor layer A.

In an embodiment of the present disclosure, a plurality of holes H that expose a part of the buffer layer 111 may be formed in the semiconductor layer A. For example, as illustrated in FIGS. 4A and 4B, the holes H may be respectively formed in the source region S and the drain region D of the semiconductor layer A. The holes H may be formed as a part of the semiconductor layer A is etched together with a preliminary metal layer when the gate electrode G, the first electrode layer EL1, and a second electrode layer EL2 are formed. According to an etchant, unlike the illustration of FIG. 4A, the buffer layer 111 may be partially etched, or only the surface of the semiconductor layer A is partially etched so that the buffer layer 111 may not be exposed. For example, the depth of the holes H may depend on the etch rate of the semiconductor layer A by the etchant used in the etching process for forming the gate electrode G, the first electrode layer EL1, and a second electrode layer EL2.

As FIG. 4A shows a cross-section of the semiconductor layer A, the semiconductor layer A may appear to be partially discontinued by the holes H. However, referring to a plan view of the semiconductor layer A illustrated in FIG. 4B, the holes H may be formed in the semiconductor layer A. The holes H may each be surrounded by a part of the semiconductor layer A. Accordingly, even when the holes H are formed in the semiconductor layer A, electrons or holes in the semiconductor layer A may move by bypassing the holes H. There is no hindrance in the movement of electrons or holes in the semiconductor layer A.

The pad connection electrode PCE may be arranged on the pad insulating layer 114 to at least partially overlap with the pad electrode PE. The pad connection electrode PCE may partially contact the pad electrode PE. A side surface of the pad insulating layer 114 that overlaps with the pad electrode PE may be surrounded by the pad connection electrode PCE.

The pad connection electrode PCE may include a material the same as that of the gate electrode G. For example, the pad connection electrode PCE may be formed in a single layer or a multilayer, and may include one or more metal selected from among, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). In an embodiment of the present disclosure, the pad connection electrode PCE may have a multilayer structure, for example, a tri-layer structure, of Ti/Al/Ti.

The pad connection electrode PCE may be simultaneously formed with the gate electrode G, the first electrode layer EL1, and the second electrode layer EL2, by patterning the preliminary metal layer. The pad connection electrode PCE may surround one side surface of the pad insulating layer 114, and may be electrically connected to the pad electrode PE. The pad connection electrode PCE may extend toward the display area DA to be connected to a voltage supply wiring, a data supply wiring, a data line, a scan line, and the like. As described in FIG. 1, the printed circuit board or the driver IC chip may be attached on the pad portion PAD. For example, the pad portion PAD may be located at a side of the substrate 100 in the peripheral area PA. The pad portion PAD (e.g., the pad electrode PE) may be exposed and not covered by any insulating layer, and may be connected to the printed circuit board or the driver IC chip. Each of various voltages, data signals, scan signals, and the like transmitted from the printed circuit board or the driver IC chip through the pad electrode PE and the pad connection electrode PCE may be transmitted to the pixel circuit PC (see FIG. 2). In other words, the pad electrode PE and the pad connection electrode PCE may function as a bridge that connects the printed circuit board or the driver IC chip to a display panel. Accordingly, the printed circuit board or the driver IC chip functioning as a controller may output a signal to the display panel or receive a signal from the display panel through the pad electrode PE and the pad connection electrode PCE.

The first insulating layer 115 may be provided to cover the semiconductor layer A, the gate electrode G, the first electrode layer EL1, the second electrode layer EL2, the upper electrode CE2 of the storage capacitor Cst, the pad connection electrode PCE, and the pad electrode PE. The semiconductor layer A, the gate electrode G, the first electrode layer EL1, the second electrode layer EL2, the upper electrode CE2 of the storage capacitor Cst, the pad connection electrode PCE, and the pad electrode PE may be covered with the first insulating layer 115. The first insulating layer 115 may be an inorganic insulating film including an inorganic material. Polysiloxane, silicon nitride ($SiN_x$), silicon oxide ($SiO_2$), silicon oxynitride (SiON), or the like may be used as the inorganic material. Furthermore, the first insulating layer 115 may be a single layer or a multilayer of silicon nitride ($SiN_x$) and silicon oxide ($SiO_2$). The first insulating layer 115 may be introduced to cover and protect some wirings on the buffer layer 111.

The first insulating layer 115 may have the first opening OP1 that partially exposes the pad electrode PE. The pad electrode PE may be connected to the printed circuit board or the driver IC chip through the first opening OP1.

A second insulating layer 117 may be arranged on the first insulating layer 115. The second insulating layer 117 may be formed in a single layer or a multilayer of a film including an organic material, and may provide a flat upper surface. The second insulating layer 117 may include, for example, a general purpose polymer such as, for example, benzocyclobutene (BCB), polyimide (PI), HMDSO (Hexamethyldisiloxane), polymethylmethacrylate (PMMA), or polystyrene (PS), polymer derivatives with a phenol group, acrylic polymer, imide based polymer, aryl ether based polymer, amide based polymer, fluorine based polymer, p-xylene based polymer, vinyl alcohol based polymer, a blend thereof, or the like.

The second insulating layer 117 may have a second opening OP2 that partially exposes the pad electrode PE. The second opening OP2 may overlap with the first opening OP1. The pad electrode PE may be connected to the printed circuit board or the driver IC chip through the first opening OP1 and the second opening OP2.

A light-emitting element 300 may be arranged on the second insulating layer 117, and may include a pixel electrode 310, an intermediate layer 320 including an organic light-emitting layer, and a counter electrode 330. The pixel electrode 310 may be an anode electrode, and the counter electrode 330 may be a cathode electrode. The light-emitting element 300 may be connected to the thin film transistor TFT through a third contact hole CNT3 defined in the first insulating layer 115 and the second insulating layer 117.

The pixel electrode 310 may be a (semi-) transmissive electrode or a reflective electrode. In an embodiment of the present disclosure, the pixel electrode 310 may include a reflective layer including, for example, silver (Ag), magnesium (Mg), aluminum (Al), platinum (Pt), palladium (Pd), gold (Au), nickel (Ni), neodymium (Nd), iridium (Ir), chromium (Cr), a compound thereof, or the like, and a transparent or semi-transparent electrode layer may be formed on the reflective layer. The transparent or semi-transparent electrode layer may include at least one of, for example, an indium tin oxide (ITO) layer, an indium zinc oxide (IZO) layer, a zinc oxide (ZnO) layer, an indium oxide ($In_2O_3$) layer, an indium gallium oxide (IGO) layer, or an aluminum zinc oxide (AZO) layer. In an embodiment of the present disclosure, as illustrated in FIG. 4A, the pixel electrode 310 may have a triple film. In an embodiment of the present disclosure, the triple film of the pixel electrode 310 may include ITO/Ag/ITO.

The pixel electrode 310 may be formed by patterning a preliminary pixel electrode layer. An etchant used to pattern the preliminary pixel electrode layer may etch together a part of the pad electrode PE exposed by the first opening OP1 and the second opening OP2. As the materials of the pixel electrode 310 and the pad electrode PE are different from each other, an etchant having a high etch selectivity of the preliminary pixel electrode layer with respect to the pad electrode PE may be used when patterning the preliminary pixel electrode layer. As a result, when patterning the preliminary pixel electrode layer, the pad electrode PE exposed by the first opening OP1 and the second opening OP2 may be prevented from being partially etched, and the pad electrode PE may be protected from the etchant.

A pixel definition layer 119 may be arranged on the second insulating layer 117, and may have an opening that covers an edge of the pixel electrode 310 and exposes a part of the pixel electrode 310. The pixel definition layer 119 may prevent generation of arc, and the like between the pixel electrode 310 and the counter electrode 330 at the edge of the pixel electrode 310, by increasing a distance between the edge of the pixel electrode 310 and the counter electrode 330 above the pixel electrode 310.

The pixel definition layer 119 may include one or more organic insulating materials selected from among, for example, polyimide, polyamide, acryl resin, benzocyclobutene and phenol resin, and may be formed by a method such as spin coating, or the like. Alternatively, the pixel definition layer 119 may include an inorganic insulating material such as, for example, silicon oxide ($SiO_2$), silicon nitride ($SiN_x$), or silicon oxynitride (SiON). Alternatively, the pixel definition layer 119 may include an organic insulating material and an inorganic insulating material.

The intermediate layer 320 is arranged in an opening defined by the pixel definition layer 119, and may include an organic light-emitting layer. The organic light-emitting layer may include an organic material including a fluorescent or phosphorescent material that emits red, green, blue, or white light. The organic light-emitting layer may include a low molecular weight organic material or a polymer organic material, and functional layers such as a hole transport layer (HTL), a hole injection layer (HIL), an electron transport layer (ETL), an electron injection layer (EIL), and the like may be further optionally arranged under and above the organic light-emitting layer. For example, the organic light-emitting layer may be interposed between the hole transport layer (HTL) and the electron transport layer (ETL).

The counter electrode 330 may be a transmissive electrode or a reflective electrode. In an embodiment of the present disclosure, the counter electrode 330 may be a transparent or semi-transparent electrode, and may include a metal thin film having a small work function and including, for example, lithium (Li), calcium (Ca), lithium fluoride/calcium (LiF/Ca), lithium fluoride/aluminum (LiF/Al), aluminum (Al), silver (Ag), magnesium (Mg), or a compound thereof. Furthermore, a transparent conductive oxide (TCO) film such as, for example, an indium tin oxide (ITO) film, an indium zinc oxide (IZO) film, a zinc oxide (ZnO) film, an indium oxide ($In_2O_3$) film, or the like may be further arranged on the metal thin film. The counter electrode 330 may be arranged over the display area DA, and may be arranged above the intermediate layer 320 and the pixel definition layer 119. The counter electrode 330 may be integrally formed over a plurality of light-emitting elements as the light-emitting element 300, and may correspond to a plurality of pixel electrodes as the pixel electrode 310.

As the organic light-emitting element may be easily damaged by external moisture, oxygen, and the like, as described below in FIG. 12, the thin film encapsulation layer 400 may protect the organic light-emitting element by covering the same. For example, the thin film encapsulation layer 400 may cover the light-emitting element 300 in the display area DA, and may prevent the light-emitting element 300 from being damaged or degraded by external impurities. The thin film encapsulation layer 400 may include a first inorganic encapsulation layer 410, an organic encapsulation layer 420, and a second inorganic encapsulation layer 430.

According to an embodiment of the present disclosure, the display apparatus 1 may include the pad electrode PE arranged in the peripheral area PA. In this state, the pad electrode PE may include a material the same as that of the semiconductor layer A arranged in the display area DA.

In a comparative example, a pad electrode arranged in a peripheral area may include a material the same as that of a gate electrode. The gate electrode and the pad electrode each may include a copper (Cu) layer. The pad electrode may be partially exposed by an insulating layer. An indium tin oxide (ITO) layer may be formed on the copper (Cu) layer to prevent the copper (Cu) layer from being exposed by the pad electrode. Accordingly, the gate electrode and the pad electrode each may have a multilayer structure of Ti/Cu/ITO.

In this case, an etchant capable of etching an indium tin oxide (ITO) layer is used to pattern the gate electrode. The etchant may etch indium gallium zinc oxide (IGZO) that is similar to indium tin oxide (ITO). Accordingly, when patterning the gate electrode, a semiconductor layer that is arranged under the gate electrode and includes indium gallium zinc oxide (IGZO) may be partially etched. The gate electrode G may not be normally patterned, and a part of the gate electrode G may be corroded. As a result, a thin film transistor including the gate electrode and the semiconductor layer may not perform a normal operation.

In another comparative example, a pad electrode arranged in a peripheral area may be arranged in a layer the same as that of a metal layer arranged under a semiconductor layer. The pad electrode may be provided between a substrate and a buffer layer. In this case, to expose a part of the pad electrode, a part of each of a buffer layer, an inorganic insulating layer, and a planarization layer is etched. While etching the buffer layer, the inorganic insulating layer, and the planarization layer, a thickness of the planarization layer may gradually decrease. When foreign materials exist on the planarization layer, the thickness of the planarization layer where the foreign materials exist may be maintained. Accordingly, while etching the buffer layer, the inorganic insulating layer, and the planarization layer, a step may be formed on a surface of the planarization layer.

A light-emitting element arranged on the planarization layer may not perform a normal operation according to a degree of the step. When even the buffer layer is etched, a degree of the step is severe so that a defect of the light-emitting element is unavoidable. In other words, the light-emitting element arranged on the planarization layer where the step is formed does not perform a normal operation so that dark spots may be generated during the driving of a display apparatus.

When the pad electrode PE includes a material the same as that of the semiconductor layer A as in an embodiment of the present disclosure, the copper (Cu) layer is not exposed by the pad electrode PE, and thus the gate electrode G may not include an indium tin oxide (ITO) layer. Accordingly, as there is no need to use an etchant capable of etching the indium tin oxide (ITO) layer to pattern the gate electrode G, corrosion of a part of the gate electrode G may be prevented.

When the pad electrode PE includes a material the same as that of the semiconductor layer A, only parts of the first insulating layer 115 and the second insulating layer 117 are etched to expose the pad electrode PE. While etching the first insulating layer 115 and the second insulating layer 117, the thickness of the second insulating layer 117 may be reduced, and a step may be formed by foreign materials existing on the second insulating layer 117. However, as no defect is caused in the light-emitting element 300 by the step formed during the etching of the first insulating layer 115 and the second insulating layer 117, the light-emitting element 300 may perform a normal operation.

Figure 5:
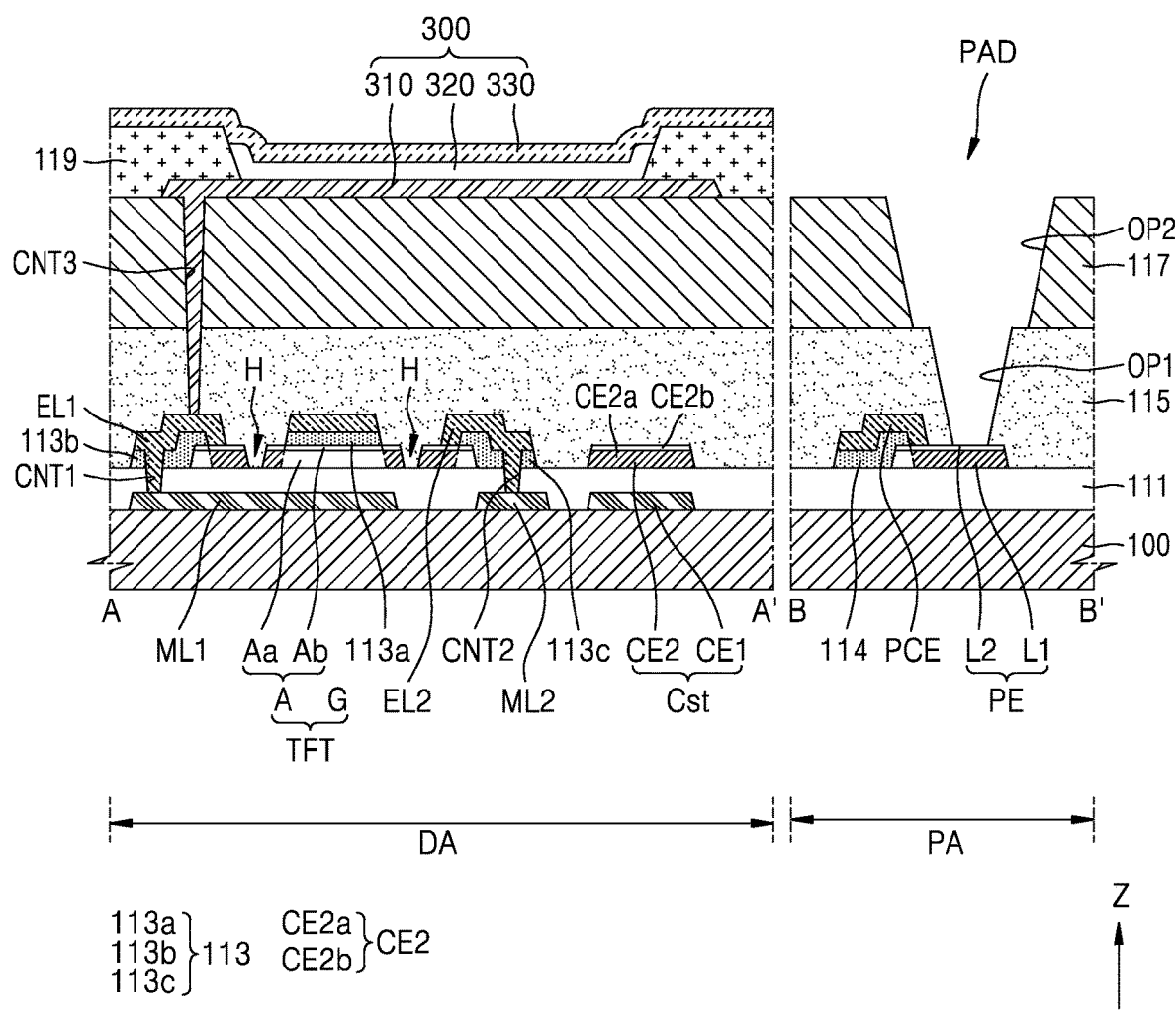
FIG. 5 is a cross-sectional view of the display area and the pad portion of FIG. 1 taken along lines A-A' and B-B', respectively, according to an embodiment of the present disclosure.

FIG. 5 is a schematic cross-sectional view of a display apparatus according to an embodiment of the present disclosure. In detail, FIG. 5 is a cross-sectional view of the display area and the pad portion of FIG. 1 taken along lines A-A' and B-B', respectively. In FIG. 5, as the same reference numbers as those of FIG. 4A denote the same constituent elements, redundant descriptions thereof are omitted. FIG. 5, as a modified embodiment of FIG. 4A, has a difference in the structure of a semiconductor layer, an upper electrode, and a pad electrode. In the following descriptions, any redundant description is replaced with the description of FIG. 4A, and differences therebetween are mainly described.

Referring to FIG. 5, the semiconductor layer A, the upper electrode CE2 of the storage capacitor Cst, and the pad electrode PE may each be formed in a multilayer. The semiconductor layer A, the upper electrode CE2 of the storage capacitor Cst, and the pad electrode PE each may have a multilayer structure.

In an embodiment of the present disclosure, as illustrated in FIG. 5, the semiconductor layer A may include a first semiconductor layer Aa and a second semiconductor layer Ab. The upper electrode CE2 of the storage capacitor Cst may include a first upper electrode CE2a and a second upper electrode CE2b. The pad electrode PE may include a first layer L1 and a second layer L2 different from the first layer L1. The second semiconductor layer Ab may be arranged on the first semiconductor layer Aa, the second upper electrode CE2b ma be arranged on the first upper electrode CE2a, and the second layer L2 may be arranged on the first layer L1.

The first semiconductor layer Aa, the first upper electrode CE2a, and the first layer L1 may each include an oxide semiconductor material. The first semiconductor layer Aa, the first upper electrode CE2a, and the first layer L1 may each include an oxide of at least one of, for example, indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), or zinc (Zn). For example, the upper electrode CE2 of the storage capacitor Cst and the pad electrode PE may each include, for example, zinc oxide (ZnO), zinc tin oxide (ZTO), zinc indium oxide (ZIO), indium oxide ($In_2O_3$), titanium oxide ($TiO_2$), indium tin zinc oxide (ITZO), indium gallium zinc oxide (IGZO), indium tin gallium oxide (ITGO), or the like. For the oxide semiconductor including two or more metals, there is no limitation on the metal composition ratio of these metals. For example, ITZO, may mean an oxide semiconductor containing indium (In), tin (Sn), and zinc (Zn), and there is no limitation on the composition ratio thereof.

The second semiconductor layer Ab, the second upper electrode CE2b, and the second layer L2 may each include a crystalline material. The crystalline material may not be etched in a subsequent etching process, and the like. Accordingly, the semiconductor layer A, the upper electrode CE2 of the storage capacitor Cst, and the pad electrode PE may be respectively protected from the subsequent process by the second semiconductor layer Ab, the second upper electrode CE2b, and the second layer L2, which include crystalline material.

In an embodiment of the present disclosure, the second semiconductor layer Ab, the second upper electrode CE2b, and the second layer L2 may each include, for example, indium tin gallium oxide (ITGO) or indium tin oxide (ITO). When the pad electrode PE includes the second layer L2 including indium tin gallium oxide (ITGO) or indium tin oxide (ITO), as indium tin gallium oxide (ITGO) or indium tin oxide (ITO) is easily crystallized by a subsequent heat treatment, and the like, the pad electrode PE may be protected in an etching process performed after the pad electrode PE is formed. Although the pad electrode PE is described as an example, the same is applied to the semiconductor layer A and the upper electrode CE2. Since the pad electrode PE is protected in the subsequent etching processes, the pixel circuit PC and the light-emitting element 300 of the display apparatus 1 fabricated through the subsequent processes may perform a normal operation.

Figure 6:
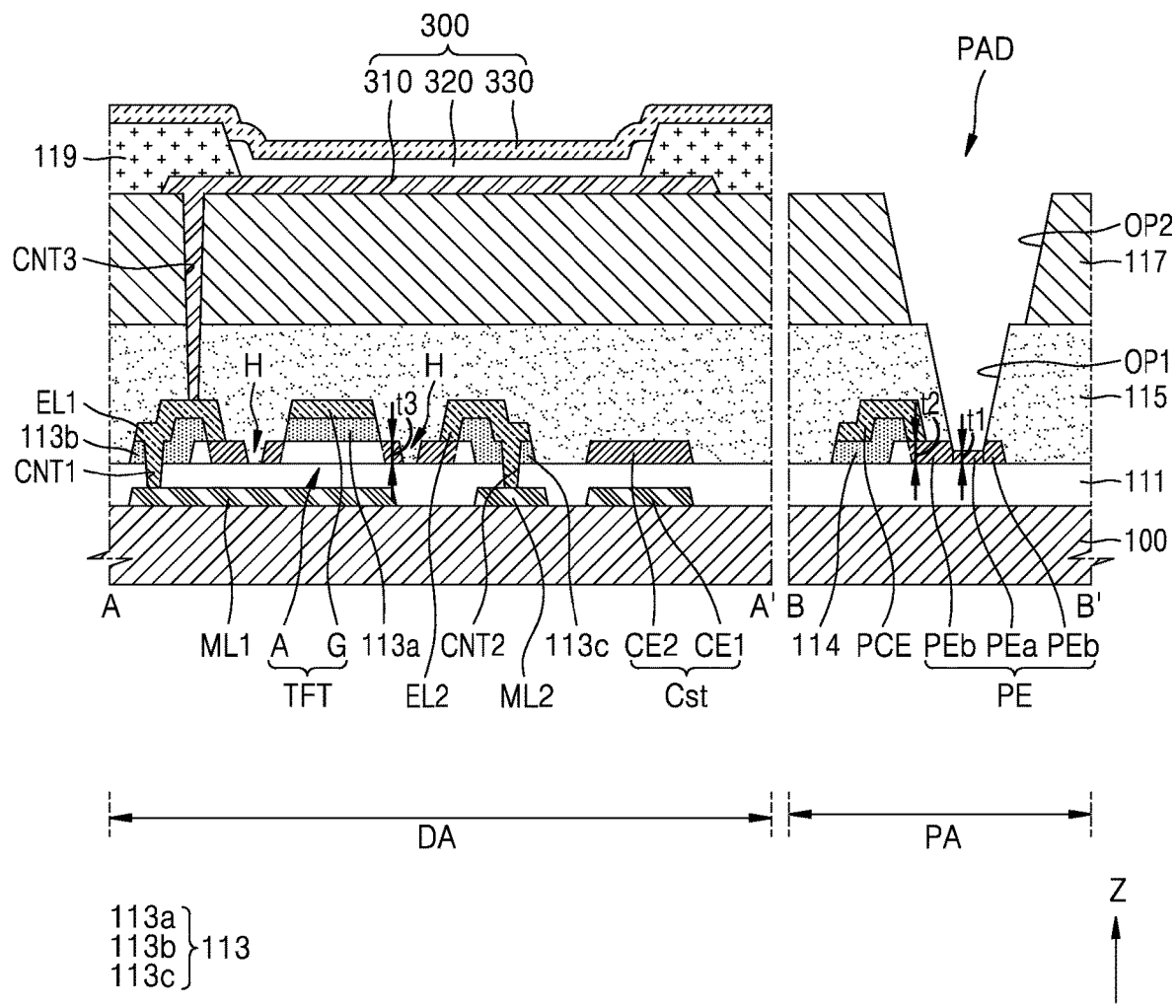
FIG. 6 is a cross-sectional view of the display area and the pad portion of FIG. 1 taken along lines A-A' and B-B', respectively, according to an embodiment of the present disclosure.

FIG. 6 is a schematic cross-sectional view of a display apparatus according to an embodiment of the present disclosure. In detail, FIG. 6 is a cross-sectional view of the display area and the pad portion of FIG. 1 taken along lines A-A' and B-B', respectively. In FIG. 6, as the same reference numbers as those of FIG. 4A denote the same constituent elements, redundant descriptions thereof are omitted. FIG. 6, as a modified embodiment of FIG. 4A, has a difference in the structure of a pad electrode. In the following descriptions, any redundant description is replaced with the description of FIG. 4A, and differences therebetween are mainly described.

Referring to FIG. 6, the pad electrode PE may include a first portion PEa and a second portion PEb.

The first portion PEa of the pad electrode PE may correspond to an exposed portion of the pad electrode PE. In other words, the first portion PEa may correspond to the first opening OP1 defined in the first insulating layer 115. As the second opening OP2 defined in the second insulating layer 117 overlaps with the first opening OP1 and partially exposes the pad electrode PE, the first portion PEa may be understood as one corresponding to the second opening OP2.

The second portion PEb of the pad electrode PE may refer to the remaining portion except the first portion PEa. The second portion PEb may be located outside the first portion PEa, and may be arranged to surround the first portion PEa.

In an embodiment of the present disclosure, the thickness t1 of the first portion PEa may be smaller than the thickness t2 of the second portion PEb. After forming the pad electrode PE, the exposed portion of the pad electrode PE may be etched together with other components being etched in the subsequent etching process, for example, a patterning process of the pixel electrode 310, and the like. In other words, as the first portion PEa is formed by using the first insulating layer 115 and/or the second insulating layer 117 as an etching mask, the plane shape of the first portion PEa may substantially correspond to the plane shape of the first opening OP1 and/or the plane shape of the second opening OP2. Depending on the sidewall profiles of the first opening OP1 and the second opening OP2, and depending on the subsequent etching process used, the size and shape of the first portion PEa may vary. For example, the plane shape of the first portion PEa may be identical to the plane shape of the bottom of the first opening OP1.

In an embodiment of the present disclosure, the thickness t2 of the second portion PEb may be the same as the thickness t3 of the semiconductor layer A. As the second portion PEb corresponds to a portion that is not exposed by the first insulating layer 115 and the second insulating layer 117, the second portion PEb is not etched in the subsequent etching process. The thickness t2 of the second portion PEb may be uniformly maintained.

The semiconductor layer A and the pad electrode PE of FIG. 6 may be formed to be thicker than the semiconductor layer A and the pad electrode PE of FIG. 4A. The semiconductor layer A and the pad electrode PE may be formed by increasing the total thickness thereof. In this case, even when the first portion PEa of the pad electrode PE is partially etched in the subsequent process, the transmission of a voltage supply or a signal through the pad electrode PE may be normally performed. As the thickness t1 of the first portion PEa may be adjusted to be similar to the thickness of the semiconductor layer A and the pad electrode PE of FIG. 4A, the transmission of a voltage supply or a signal through the pad electrode PE may be normally maintained.

Figure 7:
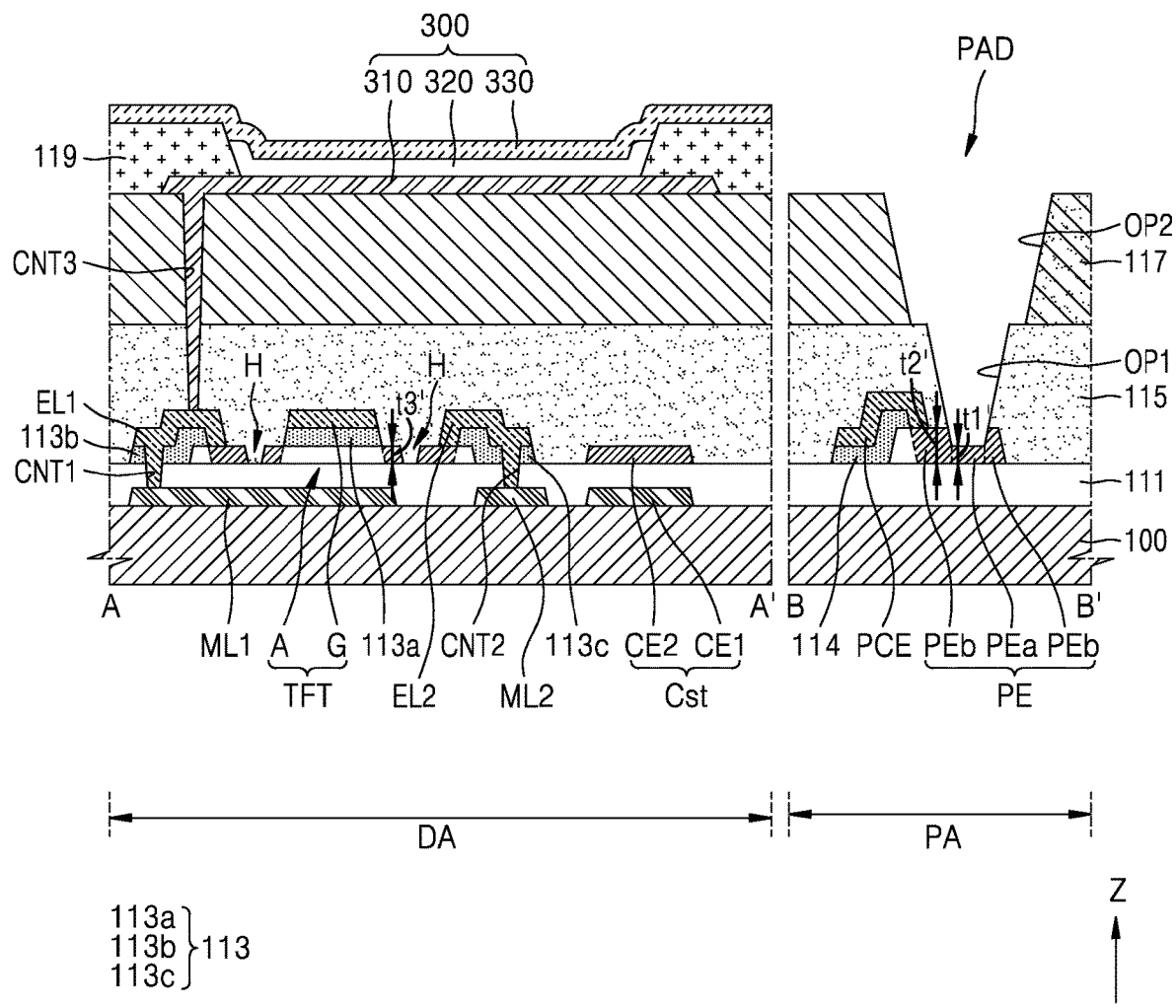
FIG. 7 is a cross-sectional view of the display area and the pad portion of FIG. 1 taken along lines A-A' and B-B', respectively, according to an embodiment of the present disclosure.

FIG. 7 is a schematic cross-sectional view of a display apparatus according to an embodiment of the present disclosure. In detail, FIG. 7 is a cross-sectional view of the display area and the pad portion of FIG. 1 taken along lines A-A' and B-B', respectively. In FIG. 7, as the same reference numbers as those of FIG. 4A denote the same constituent elements, redundant descriptions thereof are omitted. FIG. 7, as a modified embodiment of FIG. 4A, has a difference in the structure of a pad electrode. In the following descriptions, any redundant description is replaced with the description of FIG. 4A, and differences therebetween are mainly described.

Referring to FIG. 7, the pad electrode PE may include the first portion PEa and the second portion PEb.

The first portion PEa of the pad electrode PE may correspond to the exposed portion of the pad electrode PE. In other words, the first portion PEa may correspond to the first opening OP1 defined in the first insulating layer 115. As the second opening OP2 defined in the second insulating layer 117 overlaps with the first opening OP1 and partially exposes the pad electrode PE, the first portion PEa may be understood as one corresponding to the second opening OP2.

The second portion PEb of the pad electrode PE may refer to the remaining portion except the first portion PEa. The second portion PEb may be located outside the first portion PEa, and may be arranged to surround the first portion PEa.

In an embodiment of the present disclosure, the thickness t1' of the first portion PEa may be smaller than the thickness t2' of the second portion PEb. After forming the pad electrode PE, the exposed portion of the pad electrode PE may be etched together with other components being etched in the subsequent etching process, for example, a patterning process of the pixel electrode 310, and the like. In other words, as the first portion PEa is formed by using the first insulating layer 115 and/or the second insulating layer 117 as an etching mask, the plane shape of the first portion PEa may substantially correspond to the plane shape of the first opening OP1 and/or the plane shape of the second opening OP2. Depending on the sidewall profiles of the first opening OP1 and the second opening OP2, and depending on the subsequent etching process used, the size and shape of the first portion PEa may vary. For example, the plane shape of the first portion PEa may be identical to the plane shape of the bottom of the first opening OP1.

In an embodiment of the present disclosure, the thickness t2' of the second portion PEb may be greater than the thickness t3' of the semiconductor layer A. The thickness t1' of the first portion PEa may be the same as the thickness t3' of the semiconductor layer A. Although FIG. 7 illustrates that the thickness t1' of the first portion PEa is the same as the thickness t3' of the semiconductor layer A, the thickness t1' of the first portion PEa may be greater than the thickness t3' of the semiconductor layer A. In an embodiment of the present disclosure, the thickness t1' of the first portion PEa may be smaller than the thickness t3' of the semiconductor layer A.

The semiconductor layer A and the pad electrode PE may be formed by using a half-tone mask or a slit mask.

After the preliminary metal layer is coated on the entire surface of the substrate 100, a first photoresist pattern is formed corresponding to a portion where the semiconductor layer A is to be formed, and a second photoresist pattern is formed corresponding to a portion where the pad electrode PE is to be formed. In this state, the thickness of the first photoresist pattern may be smaller than the thickness of the second photoresist pattern. The first photoresist pattern and the second photoresist pattern having thicknesses different from each other may be formed by using a half-tone mask or a slit mask.

After the semiconductor layer A and the pad electrode PE are patterned by using the first photoresist pattern and the second photoresist pattern, the first photoresist pattern is removed, and then an etching process is performed one more time. As a result, the semiconductor layer A and the pad electrode PE having thicknesses different from each other are formed. The second portion PEb of the pad electrode PE that are not etched in the subsequent process may maintain the thicknesses directly after the pad electrode PE is formed. In other words, the thickness t2' of the second portion PEb may be greater than the thickness t3' of the semiconductor layer A.

A partially exposed portion of the pad electrode PE may be etched in the subsequent etching process, and the like. As a degree of etching of the pad electrode PE varies according to the condition of the subsequent etching process, the thickness t1' of the first portion PEa may be the same as, greater than, or smaller than the thickness t3' of the semiconductor layer A.

Even when the first portion PEa of the pad electrode PE is partially etched in the subsequent process, the transmission of a voltage supply or a signal through the pad electrode PE may be normally performed. As the thickness t1 of the first portion PEa may be adjusted considering a degree of being to be etched in the subsequent etching process, the transmission of a voltage supply or a signal through the pad electrode PE may be normally maintained. For example, the thickness t1' of the first portion PEa may be adjusted to be similar to the thickness of the semiconductor layer A and the pad electrode PE of FIG. 4A, and accordingly, the transmission of a voltage supply or a signal through the pad electrode PE may be normally maintained.

Figure 8:
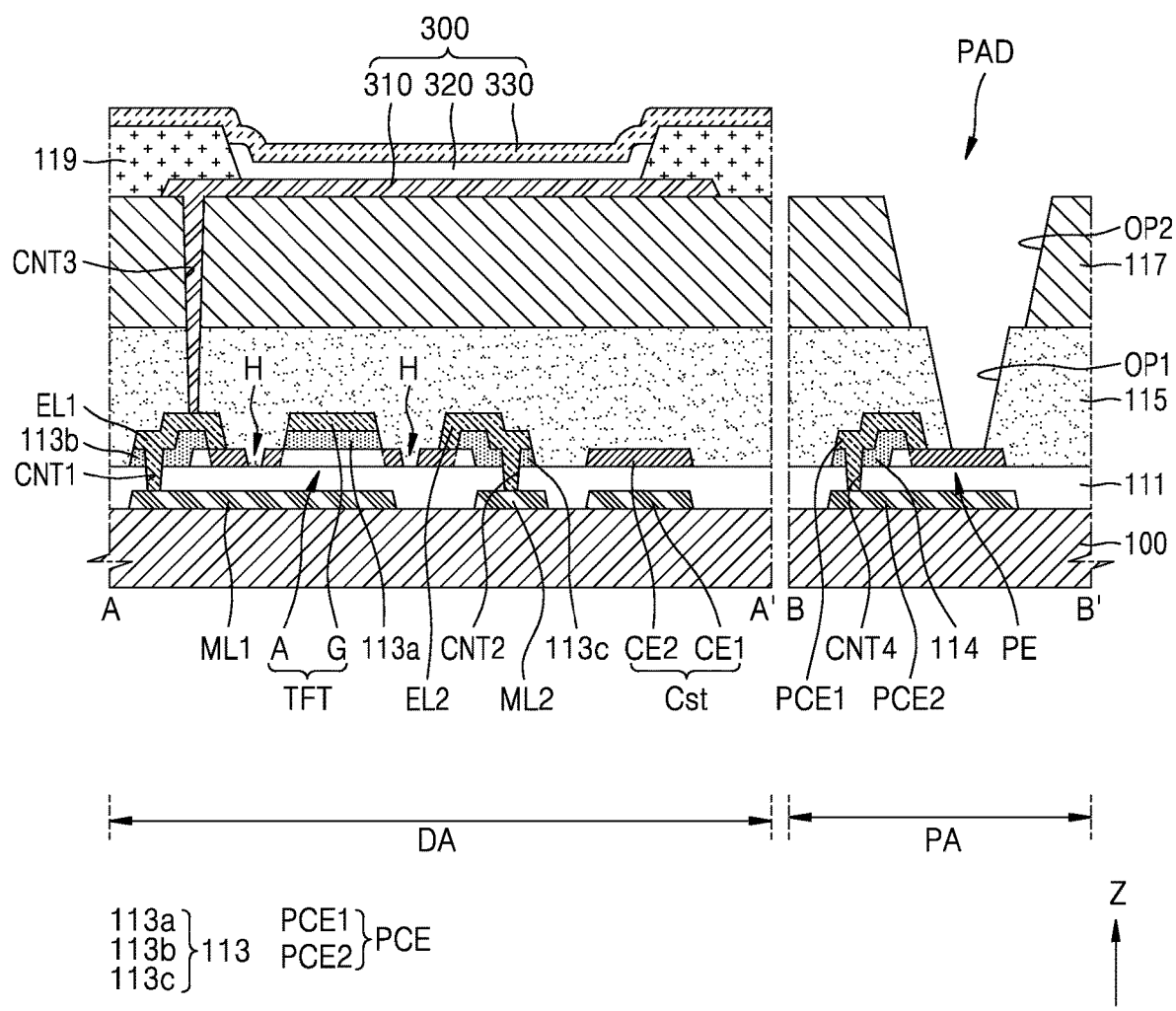
FIG. 8 is a cross-sectional view of the display area and the pad portion of FIG. 1 taken along lines A-A' and B-B', respectively, according to an embodiment of the present disclosure.

FIG. 8 is a schematic cross-sectional view of a display apparatus according to an embodiment of the present disclosure. In detail, FIG. 8 is a cross-sectional view of the display area and the pad portion of FIG. 1 taken along lines A-A' and B-B', respectively. In FIG. 8, as the same reference numbers as those of FIG. 4A denote the same constituent elements, redundant descriptions thereof are omitted. FIG. 8, as a modified embodiment of FIG. 4A, has a difference in the structure of a pad connection electrode. In the following descriptions, any redundant description is replaced with the description of FIG. 4A, and differences therebetween are mainly described.

Referring to FIG. 8, the pad connection electrode PCE may include a first pad connection electrode PCE1 and a second pad connection electrode PCE2. The first pad connection electrode PCE1 and the second pad connection electrode PCE2 may each be formed in a single layer or a multilayer and may include one or more metal selected from among, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). In an embodiment of the present disclosure, the first pad connection electrode PCE1 and the second pad connection electrode PCE2 may have a multilayer structure, for example, a tri-layer structure, of Ti/Al/Ti.

The first pad connection electrode PCE1 may be arranged on the pad insulating layer 114, and may at least partially overlap with the pad electrode PE. The first pad connection electrode PCE1 may surround one side surface of the pad insulating layer 114, and may be electrically connected to the pad electrode PE. The first pad connection electrode PCE1 may be simultaneously formed with the gate electrode G, the first electrode layer EL1, and the second electrode layer EL2, by patterning a preliminary metal layer.

The second pad connection electrode PCE2 may be provided between the substrate 100 and the buffer layer 111. The second pad connection electrode PCE2 may be simultaneously formed with the first metal layer ML1, the second metal layer ML2, and the lower electrode CE1 of the storage capacitor Cst, by patterning a preliminary metal layer different from the preliminary metal layer used in forming the first pad connection electrode PCE1. The first pad connection electrode PCE1 and the second pad connection electrode PCE2 may include the same material or may include materials different from each other.

The second pad connection electrode PCE2 may be connected to the first pad connection electrode PCE1 through a fourth contact hole CNT4 defined in the pad insulating layer 114 and the buffer layer 111. The second pad connection electrode PCE2 may extend toward the display area DA to be connected to a voltage supply wiring, a data supply wiring, a data line, a scan line, and the like. As described in FIG. 1, the printed circuit board or the driver IC chip may be attached on the pad portion PAD. Each of various voltages, data signals, scan signals, and the like transmitted from the printed circuit board or the driver IC chip through the pad electrode PE and the pad connection electrode PCE may be transmitted to the pixel circuit PC (see FIG. 2). In other words, the pad electrode PE and the pad connection electrode PCE may function as a bridge that connects the printed circuit board or the driver IC chip to the display panel. Accordingly, the printed circuit board or the driver IC chip functioning as a controller may output a signal to the display panel or receive a signal from the display panel through the pad electrode PE and the pad connection electrode PCE.

Figure 9:
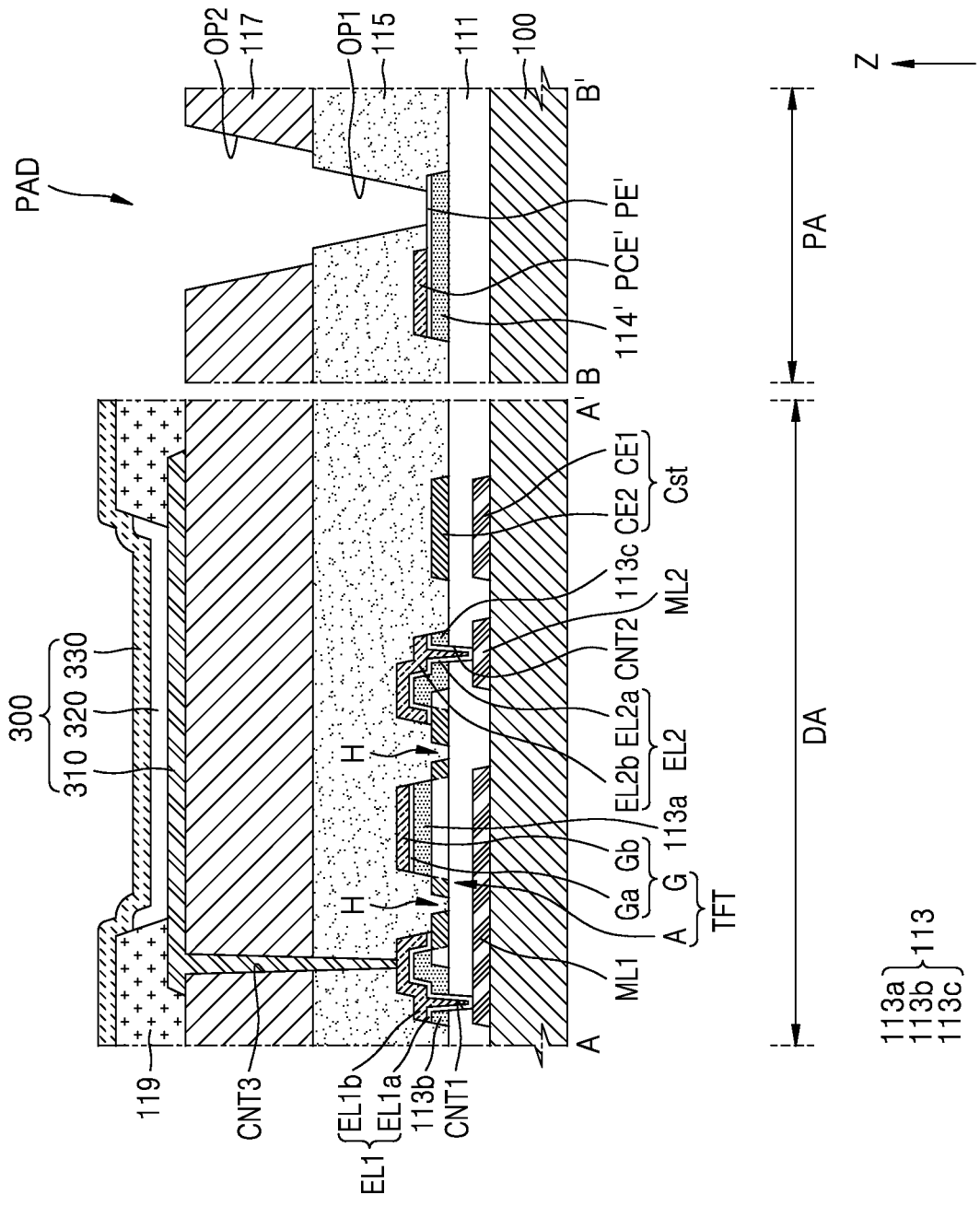
FIG. 9 is a cross-sectional view of the display area and the pad portion of FIG. 1 taken along lines A-A' and B-B', respectively, according to an embodiment of the present disclosure.

FIG. 9 is a schematic cross-sectional view of a display apparatus according to an embodiment of the present disclosure. FIG. 9 is a cross-sectional view of the display area and the pad portion of FIG. 1 taken along lines A-A' and B-B', respectively. In FIG. 9, as the same reference numbers as those of FIG. 4A denote the same constituent elements, redundant descriptions thereof are omitted.

Referring to FIG. 9, the gate electrode G may be arranged on the gate insulating layer 113 to partially overlap the semiconductor layer A. Furthermore, the first electrode layer EL1 and the second electrode layer EL2 may be arranged on the gate insulating layer 113.

The gate electrode G, the first electrode layer EL1, and the second electrode layer EL2 may have a multilayer structure. For example, as illustrated in FIG. 9, the gate electrode G may include a lower gate electrode Ga and an upper gate electrode Gb, the first electrode layer EL1 may include a first lower electrode layer EL1a and a first upper electrode layer EL1b, and the second electrode layer EL2 may include a second lower electrode layer EL2a and a second upper electrode layer EL2b. The upper gate electrode Gb may be arranged on the lower gate electrode Ga, the first upper electrode layer EL1b may be arranged on the first lower electrode layer EL1a, and the second upper electrode layer EL2b may be arranged on the second lower electrode layer EL2a.

The lower gate electrode Ga, the first lower electrode layer EL1a, and the second lower electrode layer EL2a may each include an oxide semiconductor material. The lower gate electrode Ga, the first lower electrode layer EL1a, and the second lower electrode layer EL2a may each include an oxide of at least one material of, for example, indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), or zinc (Zn). For example, the lower gate electrode Ga, the first lower electrode layer EL1a, and the second lower electrode layer EL2a may each include, for example, titanium (Ti), molybdenum titanium (MoTi), indium tin oxide (ITO), indium gallium zinc oxide (IGZO), indium tin gallium oxide (ITGO), or the like.

The upper gate electrode Gb, the first upper electrode layer EL1b, and the second upper electrode layer EL2b may each include one or more metal selected from among, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

A pad insulating layer 114' may be arranged on the buffer layer 111 corresponding to the peripheral area PA. The pad insulating layer 114' may include, for example, a silicon oxide ($SiO_2$) layer, a silicon nitride ($SiN_x$) layer, a silicon oxynitride (SiON) layer, an aluminum oxide ($Al_2O_3$) layer, a titanium oxide ($TiO_2$) layer, a tantalum oxide ($Ta_2O_5$) layer, a hafnium oxide ($HfO_2$) layer, a zinc oxide ($ZnO_2$) layer, or the like.

A pad electrode PE' may be arranged on the pad insulating layer 114'.

In an embodiment of the present disclosure, the pad electrode PE' may include a material the same as that of the lower gate electrode Ga. The pad electrode PE' may include an oxide semiconductor material. The pad electrode PE' may include an oxide of at least one material of, for example, indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), or zinc (Zn). For example, the pad electrode PE' may include, for example, titanium (Ti), molybdenum titanium (MoTi), indium tin oxide (ITO), indium gallium zinc oxide (IGZO), indium tin gallium oxide (ITGO), or the like.

When the pad electrode PE' includes indium tin oxide (ITO) or indium tin gallium oxide (ITGO), as indium tin oxide (ITO) or indium tin gallium oxide (ITGO) may be easily crystalized in a subsequent heat treatment, and the like, the pad electrode PE' may be protected in an etching process performed after the pad electrode PE' is formed.

When the pad electrode PE' includes titanium (Ti) or molybdenum titanium (MoTi), as the materials of the pixel electrode 310 and the pad electrode PE' are different from each other, an etchant having a large etch selectivity of the preliminary pixel electrode layer with respect to the pad electrode PE' may be used when patterning the preliminary pixel electrode layer. As a result, when patterning the pixel electrode 310, partially etching of the pad electrode PE' exposed by the first opening OP1 and the second opening OP2 may be prevented, and the pad electrode PE' may be protected from the etchant.

A pad connection electrode PCE' that partially contacts an upper surface of the pad electrode PE' may be arranged on the pad electrode PE'. As the pad connection electrode PCE' partially contacts the upper surface of the pad electrode PE', a partial upper surface of the pad electrode PE' may be exposed.

In an embodiment of the present disclosure, the pad connection electrode PCE' may include a material the same as that of the upper gate electrode Gb. The pad connection electrode PCE' may include one or more metal selected from among, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

The pad connection electrode PCE' may be formed by using a half-tone mask or a slit mask. For example, after the preliminary metal layer having a multilayer structure is coated on the entire surface of the substrate 100, the first photoresist pattern is formed corresponding to a portion overlapping the pad electrode PE', and the second photoresist pattern is formed corresponding to a portion to expose the upper surface of the pad electrode PE'. In this state, the thickness of the first photoresist pattern may be greater than the thickness of the second photoresist pattern. The first photoresist pattern and the second photoresist pattern having thicknesses different from each other may be formed by using a half-tone mask or a slit mask.

After patterning the pad connection electrode PCE' and the pad electrode PE' by using the first photoresist pattern and the second photoresist pattern, the second photoresist pattern is removed and the etching process is performed one more time. As a result, the pad connection electrode PCE' is formed that partially exposes the upper surface of the pad electrode PE'.

The etchant used for patterning the pad connection electrode PCE' and the pad electrode PE' may be different from the etchant used for an etching process that is additionally performed later. The etchant used for patterning the pad connection electrode PCE' and the pad electrode PE' may correspond to an etchant capable of etching both of the pad connection electrode PCE' and the pad electrode PE', and the etchant used for an additional etching process may be an etchant having a large etch selectivity of the pad connection electrode PCE' with respect to the pad electrode PE'. Although the pad connection electrode PCE' is etched by the etchant used for the additional etching process, the pad electrode PE' may not be etched.

The first insulating layer 115 and the second insulating layer 117 may be sequentially arranged on the pad connection electrode PCE'.

The upper surface and the side surface of the pad connection electrode PCE' may be surrounded by the first insulating layer 115. The upper surface and the side surface of the pad connection electrode PCE' may directly contact the first insulating layer 115. The pad connection electrode PCE' including copper (Cu), and the like may not be exposed to the outside by the first insulating layer 115. During circuit driving, when copper (Cu) having high reactivity is exposed to the outside, an unexpected operation may be performed so that normal driving may not be performed. However, as the pad connection electrode PCE' including copper (Cu) is not exposed to the outside by the first insulating layer 115, the copper (Cu) does not react to the outside, thereby performing normal driving.

The first insulating layer 115 may have the first opening OP1 that exposes a part of the pad electrode PE' exposed by the pad connection electrode PCE'. The second insulating layer 117 may have the second opening OP2 that exposes a part of the pad electrode PE' exposed by the pad connection electrode PCE'. The first opening OP1 and the second opening OP2 may overlap with each other. Since the pad electrode PE' is protected in the subsequent etching processes, the pixel circuit PC and the light-emitting element 300 of the display apparatus 1 fabricated through the subsequent processes may perform a normal operation. The pad electrode PE' may contact the printed circuit board or the driver IC chip through the first opening OP1 and the second opening OP2. Accordingly, the printed circuit board or the driver IC chip functioning as a controller may output a signal to the display panel or receive a signal from the display panel through the pad electrode PE' and the pad connection electrode PCE'.

Figure 10:
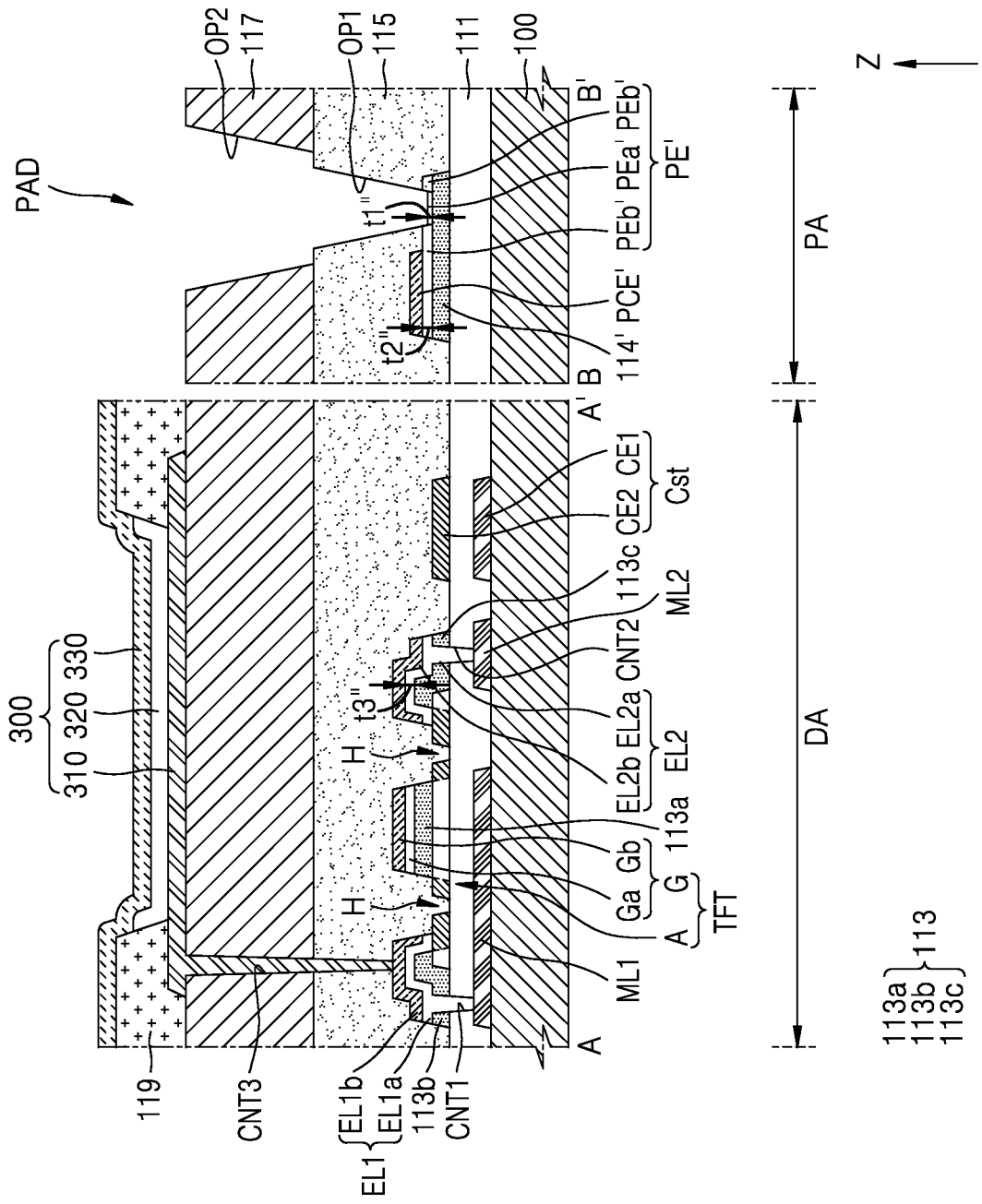
FIG. 10 is a cross-sectional view of the display area and the pad portion of FIG. 1 taken along lines A-A' and B-B', respectively, according to an embodiment of the present disclosure.

FIG. 10 is a schematic cross-sectional view of a display apparatus according to an embodiment of the present disclosure. In detail, FIG. 10 is a cross-sectional view of the display area and the pad portion of FIG. 1 taken along lines A-A' and B-B', respectively. In FIG. 10, as the same reference numbers as those of FIG. 9 denote the same constituent elements, redundant descriptions thereof are omitted. FIG. 10, as a modified embodiment of FIG. 9, has a difference in the structure of a pad electrode. In the following descriptions of FIG. 10, any redundant description is replaced with the description of FIG. 9, and differences therebetween are mainly described.

Referring to FIG. 10, the pad electrode PE' may include a first portion PEa' and a second portion PEb'.

The first portion PEa' of the pad electrode PE' may correspond to an exposed portion of the pad electrode PE'. In other words, the first portion PEa' may correspond to the first opening OP1 defined in the first insulating layer 115. As the second opening OP2 defined in the second insulating layer 117 overlaps with the first opening OP1 and partially exposes the pad electrode PE', the first portion PEa' may be understood as one corresponding to the second opening OP2.

The second portion PEb' of the pad electrode PE' may refer to the remaining portion except the first portion PEa'. The second portion PEb' may be located outside the first portion PEa', and may be arranged to surround the first portion PEa'.

In an embodiment of the present disclosure, the thickness t1" of the first portion PEa' may be smaller than the thickness t2" of the second portion PEb'. After the pad electrode PE' is formed, in the subsequent etching process, for example, a patterning process of the pixel electrode 310, and the like, the exposed portion of the pad electrode PE' may be etched together with other components such as, for example, the pixel electrode 310 being etched. In other words, as the first portion PEa' is formed by using the first insulating layer 115 and/or the second insulating layer 117 as an etching mask, the plane shape of the first portion PEa' may substantially correspond to the plane shape of the first opening OP1 and/or the plane shape of the second opening OP2. Depending on the sidewall profiles of the first opening OP1 and the second opening OP2, and depending on the subsequent etching process used, the size and shape of the first portion PEa' may vary. For example, the plane shape of the first portion PEa' may be identical to the plane shape of the bottom of the first opening OP1.

In an embodiment of the present disclosure, the thickness t2" of the second portion PEb' may be the same as the thickness t3" of the lower gate electrode Ga. As the second portion PEb' corresponds to a portion that is not exposed by the first insulating layer 115 and the second insulating layer 117, the second portion PEb' may not be etched in the subsequent etching process. The thickness t2" of the second portion PEb' may be uniformly maintained.

Although FIG. 10 illustrates that the thickness t2" of the second portion PEb' is the same as the thickness t3" of the lower gate electrode Ga, the present disclosure is not limited thereto. For example, the thickness t2" of the second portion PEb' may be greater than the thickness t3" of the lower gate electrode Ga.

The lower gate electrode Ga and the pad electrode PE' may be formed to be thicker than the lower gate electrode Ga and the pad electrode PE' of FIG. 9. The lower gate electrode Ga and the pad electrode PE' may be formed by increasing the total thickness thereof. In this case, even when the first portion PEa' of the pad electrode PE' is partially etched in the subsequent process, the transmission of a voltage supply or a signal through the pad electrode PE' may be normally performed. As the thickness t1" of the first portion PEa' may be adjusted to be similar to the thicknesses of the lower gate electrode Ga and the pad electrode PE' of FIG. 9, the transmission of a voltage supply or a signal through the pad electrode PE' may be normally maintained.

Figure 11:
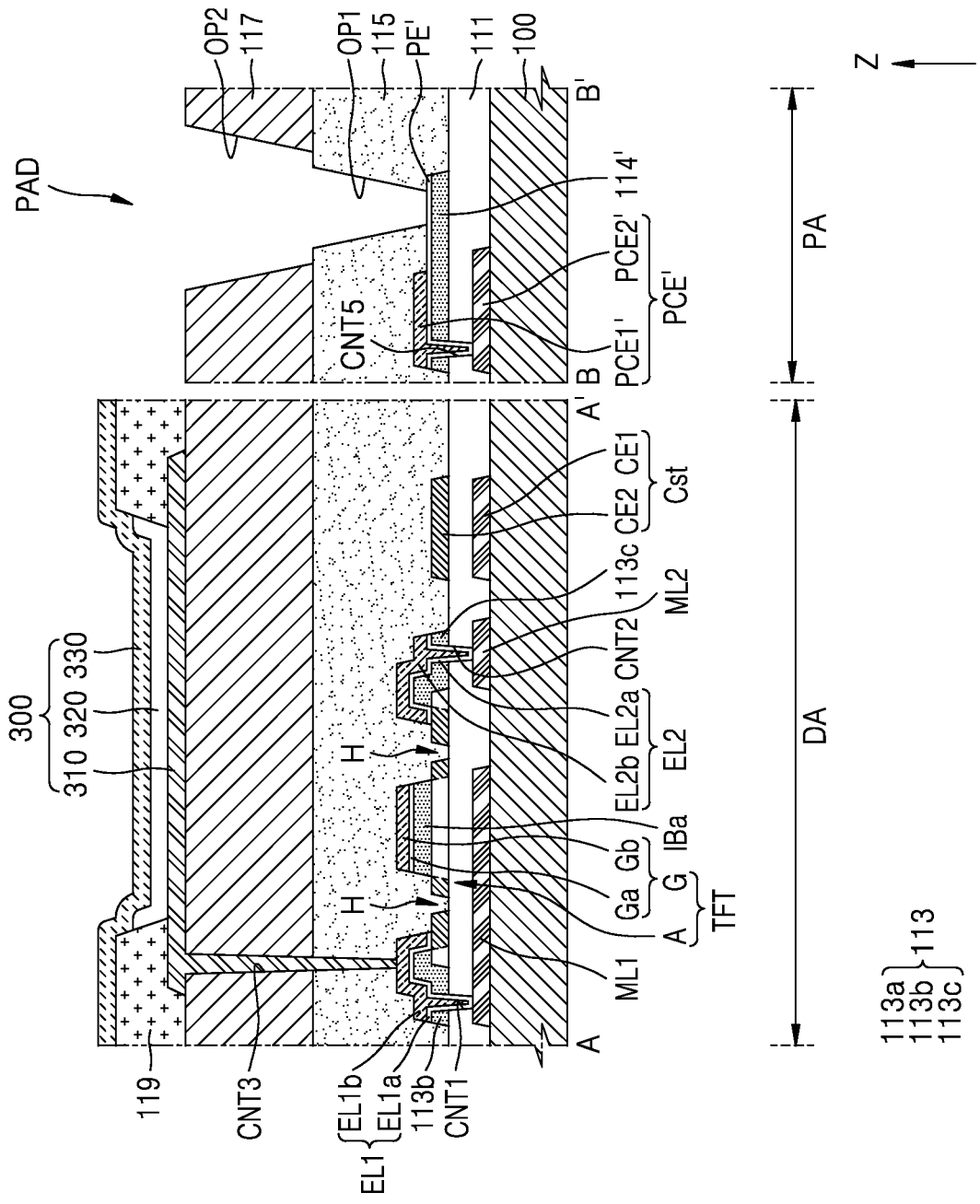
FIG. 11 is a cross-sectional view of the display area and the pad portion of FIG. 1 taken along lines A-A' and B-B', respectively, according to an embodiment of the present disclosure.

FIG. 11 is a schematic cross-sectional view of a display apparatus according to an embodiment of the present disclosure. In detail, FIG. 11 is a cross-sectional view of the display area and the pad portion of FIG. 1 taken along lines A-A' and B-B', respectively. In FIG. 11, as the same reference numbers as those of FIG. 9 denote the same constituent elements, redundant descriptions thereof are omitted. FIG. 11, as a modified embodiment of FIG. 9, has a difference in the structure of a pad connection electrode and a pad electrode. In the following descriptions of FIG. 11, any redundant description is replaced with the description of FIG. 9, and differences therebetween are mainly described.

Referring to FIG. 11, the pad connection electrode PCE' may include a first pad connection electrode PCE1' and a second pad connection electrode PCE2'. The first pad connection electrode PCE1' and the second pad connection electrode PCE2' may each be formed in a single layer or a multilayer, and may include one or more metal selected from among, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

The first pad connection electrode PCE1' may be arranged on the pad electrode PE', and may at least partially overlap with the upper surface of the pad electrode PE'. The first pad connection electrode PCE1' may be electrically connected to the pad electrode PE'. The pad electrode PE' and the first pad connection electrode PCE1' may be simultaneously formed with the gate electrode G, the first electrode layer EL1, and the second electrode layer EL2, by patterning a preliminary metal layer having a multilayer structure.

The second pad connection electrode PCE2' may be provided between the substrate 100 and the buffer layer 111. The second pad connection electrode PCE2' may be simultaneously formed with the first metal layer ML1, the second metal layer ML2, and the lower electrode CE1 of the storage capacitor Cst, by patterning a preliminary metal layer different from the preliminary metal layer used in forming the pad electrode PE' and the first pad connection electrode PCE1'. The first pad connection electrode PCE1' and the second pad connection electrode PCE2' may include the same material or may include materials different from each other.

The second pad connection electrode PCE2' may be connected to the pad electrode PE' and the first pad connection electrode PCE1' through a fifth contact hole CNT5 defined in the pad insulating layer 114' and the buffer layer 111. In this state, a part of the pad electrode PE' may be embedded in the fifth contact hole CNT5. The second pad connection electrode PCE2' may extend toward the display area DA to be connected to a voltage supply wiring, a data supply wiring, a data line, a scan line, and the like. As described in FIG. 1, the printed circuit board or the driver IC chip may be attached on the pad portion PAD. For example, the pad portion PAD may be located at a side of the substrate 100 in the peripheral area PA. The pad portion PAD (e.g., the pad electrode PE') may be exposed and not covered by any insulating layer, and may be connected to the printed circuit board or the driver IC chip. Each of various voltages, data signals, scan signals, and the like transmitted from the printed circuit board or the driver IC chip through the pad electrode PE' and the pad connection electrode PCE' may be transmitted to the pixel circuit PC (see FIG. 2). In other words, the pad electrode PE' and the pad connection electrode PCE' may function as a bridge that connects the printed circuit board or the driver IC chip to the display panel. Accordingly, the printed circuit board or the driver IC chip functioning as a controller may output a signal to the display panel or receive a signal from the display panel through the pad electrode PE' and the pad connection electrode PCE'.

Figure 12:
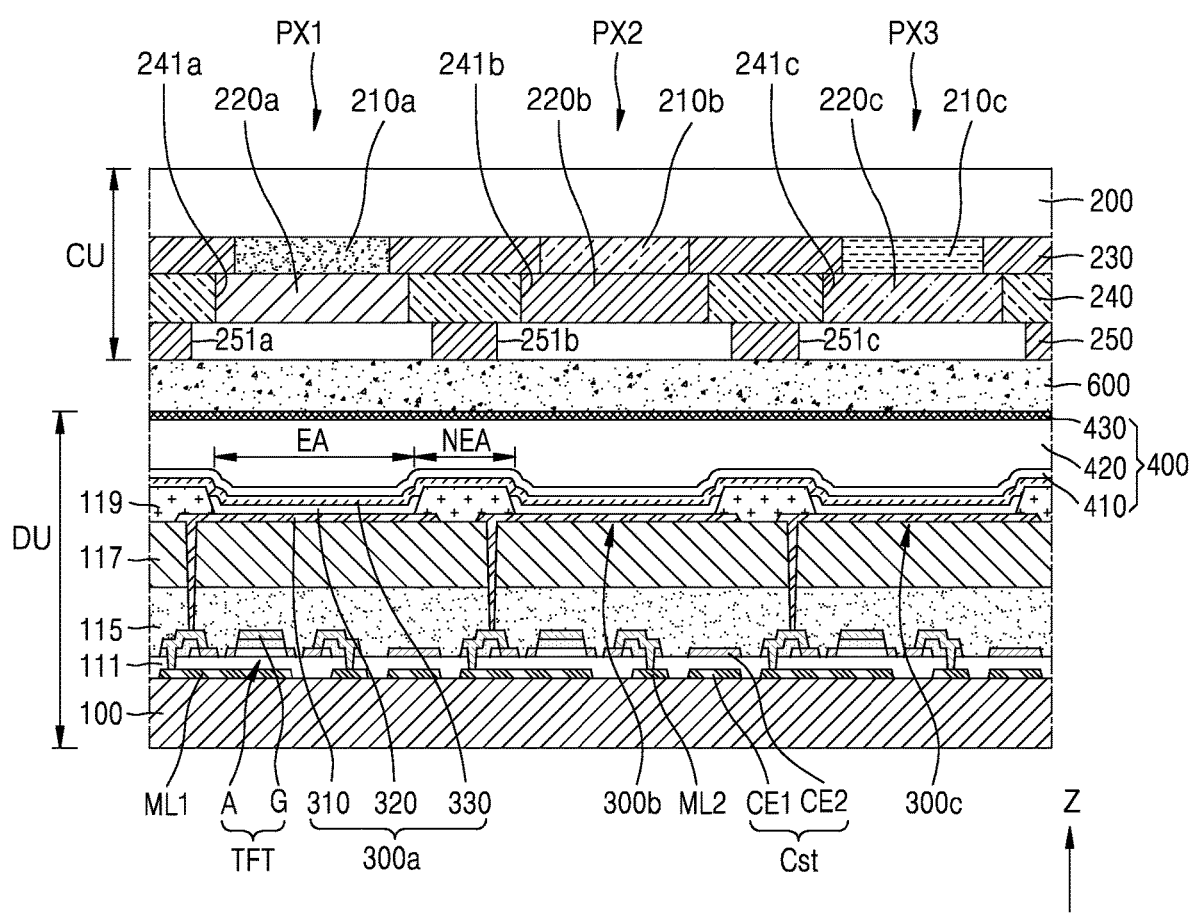
FIG. 12 is a schematic cross-sectional view of a display apparatus according to an embodiment of the present disclosure.

FIG. 12 is a schematic cross-sectional view of a display apparatus according to an embodiment of the present disclosure. In FIG. 12, as the same reference numbers as those of FIG. 4A denote the same constituent elements, redundant descriptions thereof are omitted.

Referring to FIG. 12, at least one thin film transistor TFT and the display device connected to the thin film transistor TFT may be arranged in the display area DA of the display apparatus 1 according to an embodiment of the present disclosure (see FIG. 1).

The display area DA of the display apparatus 1 may include first to third pixels PX1, PX2, and PX3. This is merely exemplary, and the present disclosure is not limited thereto. For example, the display apparatus 1 may include pixels more than three. In addition, although FIG. 12 illustrates that the first to third pixels PX1, PX2, and PX3 are adjacent to one another, the present disclosure is not limited thereto. In other words, other constituent elements such as wiring, and the like may be provided among the first to third pixels PX1, PX2, and PX3. Accordingly, for example, the first pixel PX1 and the second pixel PX2 may not be pixels that are located adjacent to each other. Furthermore, in FIG. 12, the cross-sections of the first to third pixels PX1, PX2, and PX3 may not be cross-sections in the same direction.

Each of the first to third pixels PX1, PX2, and PX3 may include an emission area EA. The emission area EA is an area where light is generated and output to the outside. A non-emission area NEA is arranged between the emission areas EA, and thus the emission area EA may be defined by the non-emission area NEA.

The first to third pixels PX1, PX2, and PX3 may implement light different from one another. For example, the first pixel PX1, the second pixel PX2, and the third pixel PX3 may implement red light, green light, and blue light, respectively. When viewed on the plane, the emission area EA may have various polygonal or circular shapes, and may have various arrangements such as, for example, a stripe arrangement, a pentile arrangement, a mosaic arrangement, and the like.

The display apparatus 1 may include each of the first quantum dot layer 220*a*, the second quantum dot layer 220*b*, and the transparent layer 220*c*, corresponding to the emission area EA. The first quantum dot layer 220*a*, the second quantum dot layer 220*b*, and the transparent layer 220*c* may include quantum dots and metal nano particles.

In an embodiment of the present disclosure, the first quantum dot layer 220*a*, the second quantum dot layer 220*b*, and the transparent layer 220*c* may each include a quantum dot. In an embodiment of the present disclosure, the transparent layer 220*c* may not include a quantum dot. The quantum dot is a particle having a crystal structure of several to tens of nanometers in size, and may include hundreds to thousands of atoms. The quantum dot fluorescent material or a phosphorescent material when used in a display device can produce pure monochromatic red, green, and blue light. Light of a desired wavelength range may be obtained by controlling the composition of the quantum dot, for example, controlling band gap of the quantum dot. On the other hand, even quantum dot that includes the same material may emit different wavelengths according to its particle size. Thus, the quantum dot may control color of emitted light according to the particle size.

The first pixel PX1, the second pixel PX2, and the third pixel PX3 may include the first quantum dot layer 220*a*, the second quantum dot layer 220*b*, and the transparent layer 220*c*, respectively.

In an embodiment of the present disclosure, an average size of the quantum dots included in the first quantum dot layer 220*a* and an average size of the quantum dots included the second quantum dot layer 220*b* may be different from each other.

The display apparatus 1 according to an embodiment of the present disclosure is described below in detail according to the stack order illustrated in FIG. 12.

The substrate 100 (hereinafter, referred to as the lower substrate) may include, for example, a glass material, a ceramic material, a metal material, or a material having flexible or bendable characteristics. A barrier layer may be further included between the lower substrate 100 and the buffer layer 111.

The first metal layer ML1, the second metal layer ML2, and the lower electrode CE1 of the storage capacitor Cst may be arranged on the lower substrate 100, and the semiconductor layer A and the upper electrode CE2 of the storage capacitor Cst may be arranged on the buffer layer 111. The gate electrode G may be arranged on the semiconductor layer A to at least partially overlap with the semiconductor layer A with the gate insulating layer 113 interposed therebetween.

The first insulating layer 115 may be provided to cover the gate electrode G. The second insulating layer 117 may be arranged on the first insulating layer 115, and the first to third light-emitting elements 300*a*, 300*b*, and 300*c* may be arranged on the second insulating layer 117. The first to third light-emitting elements 300*a*, 300*b*, and 300*c* may each commonly include the pixel electrode 310, the intermediate layer 320 including an organic light-emitting layer, and the counter electrode 330. The pixel definition layer 119 may be arranged on the second insulating layer 117.

As the first to third light-emitting elements 300*a*, 300*b*, and 300*c* may be easily damaged by external moisture, oxygen, and the like, the first to third light-emitting elements 300*a*, 300*b*, and 300*c* may be protected by being covered with the thin film encapsulation layer 400. The thin film encapsulation layer 400 may cover the display area DA and extend to the outside of the display area DA. The thin film encapsulation layer 400 may include at least one organic encapsulation layer and at least one inorganic encapsulation layer. In an embodiment of the present disclosure, the number of organic encapsulation layers and the number of inorganic encapsulation layers and an order of stacking organic encapsulation layers and inorganic encapsulation layers may be variously changed. For example, the thin film encapsulation layer 400 may include the first inorganic encapsulation layer 410, the organic encapsulation layer 420, and the second inorganic encapsulation layer 430.

The first inorganic encapsulation layer 410 may cover the counter electrode 330, and may include, for example, a silicon oxide ($SiO_2$) layer, a silicon nitride ($SiN_x$) layer, and/or a silicon oxynitride (SiON) layer. Other layers such as a capping layer, and the like may be provided between the first inorganic encapsulation layer 410 and the counter electrode 330. As the first inorganic encapsulation layer 410 is formed along a structure thereunder, an upper surface of the first inorganic encapsulation layer 410 may not be flat. The organic encapsulation layer 420 may cover the first inorganic encapsulation layer 410, and unlike the first inorganic encapsulation layer 410, may make an upper surface thereof to be approximately flat. The first inorganic encapsulation layer 410 and the second inorganic encapsulation layer 430 may protect the pixels PX from moisture/oxygen. The organic encapsulation layer 420 may protect the pixels PX from foreign materials such as dust particles.

Even when cracks are generated in the thin film encapsulation layer 400 through the above-described multilayer structure, the thin film encapsulation layer 400 may prevent the cracks from being connected to each other between the first inorganic encapsulation layer 410 and the organic encapsulation layer 420 or between the organic encapsulation layer 420 and the second inorganic encapsulation layer 430. As such, forming a path through which external moisture, oxygen, and the like intrudes into the display area DA may be prevented or reduced.

The upper substrate 200 may be located above the lower substrate 100, and the counter electrode 330 may be provided between the upper substrate 200 and the lower substrate 100. The upper substrate 200 may include, for example, glass, metal, or polymer resin. When the upper substrate 200 has flexible or bendable characteristics, the upper substrate 200 may include polymer resin such as, for example, polyethersulfone, polyacrylate, polyetherimide, polyethylene naphthalate, polyethylene terephthalate, polyphenylene sulfide, polyarylate, polyimide, polycarbonate, or cellulose acetate propionate. Also, the upper substrate 200 may have a multilayer structure including two layers, each including the above-described polymer resin, and a barrier layer provided between the layers and including an inorganic material such as, for example, silicon oxide ($SiO_2$), silicon nitride ($SiN_x$), silicon oxynitride (SiON), or the like, and various modifications thereof are possible.

A light shield layer 230 is arranged on a lower surface of the upper substrate 200 in a direction toward the lower substrate 100. The light shield layer 230 may include openings corresponding to the first to third light-emitting elements 300a, 300b, and 300c, and the first to third filter layers 210a, 210b, and 210c are respectively located in the openings. The light shield layer 230 may be a layer to enhance color sharpness and contrast, as a black matrix. The light shield layer 230 may include at least one of, for example, a black pigment, a black dye, or black particles. For example, the light shield layer 230 may prevent the color mixing of the lights generated from the first to third light-emitting elements 300a, 300b, and 300c. In an embodiment of the present disclosure, the light shield layer 230 may include, for example, chromium (Cr), chromium oxide ($CrO_X$), chromium/chromium oxide ($Cr/CrO_X$), chromium/chromium oxide/chromium nitride ($Cr/CrO_X/CrN_Y$), resin (carbon pigment, RGB (red green blue) mixed pigment), graphite, a non-Cr based material, or the like.

The first filter layer 210a may transmit only light of a wavelength in a range from about 630 nm to about 780 nm, the second filter layer 210b may transmit only light of a wavelength in a range from about 495 nm to about 570 nm, and the third filter layer 210c may transmit only light of a wavelength in a range from about 450 nm to about 495 nm. The first to third filter layers 210a, 210b, and 210c may reduce the reflection of external light in the display apparatus 1.

A first upper insulating layer 240 is arranged on the light shield layer 230. The first upper insulating layer 240 may include a first-1 opening 241a corresponding to the first light-emitting element 300a, a first-2 opening 241b corresponding to the second light-emitting element 300b, and a first-3 opening 241c corresponding to the third light-emitting element 300c. The first quantum dot layer 220a is located in the first-1 opening 241a, the second quantum dot layer 220b is located in the first-2 opening 241b, and the transparent layer 220c is located in the first-3 opening 241c. The first quantum dot layer 220a and the second quantum dot layer 220b may be formed in an inkjet printing method.

The first upper insulating layer 240 may include, for example, an organic material. In some cases, the first upper insulating layer 240 may include a light shield material to function as a light shield layer. The light shield material may include at least one of, for example, a black pigment, a black dye, black particles, or metal particles. In an embodiment of the present disclosure, the first upper insulating layer 240 may be blue.

The first quantum dot layer 220a may transform light in a first wavelength band generated in the intermediate layer 320 on the pixel electrode 310 to light in a second wavelength band. For example, when light of a wavelength in a range from about 450 nm to about 495 nm is generated in the intermediate layer 320 on the pixel electrode 310, the first quantum dot layer 220a may transform the light to the light of a wavelength in a range from about 630 nm to about 780 nm. Accordingly, in the first pixel PX1, the light of a wavelength in a range from about 630 nm to about 780 nm is emitted to the outside through the upper substrate 200.

The second quantum dot layer 220b may transform the light in the first wavelength band generated in the intermediate layer 320 on the pixel electrode 310 to light in a third wavelength band. For example, when light of a wavelength in a range from about 450 nm to about 495 nm is generated in the intermediate layer 320 on the pixel electrode 310, the second quantum dot layer 220b may transform the light to light of a wavelength in a range from about 495 nm to about 570 nm. Accordingly, in the second pixel PX2, the light of a wavelength in a range from about 495 nm to about 570 nm is emitted to the outside through the upper substrate 200.

The first quantum dot layer 220a and the second quantum dot layer 220b may each have a form in which quantum dots are scattered in resin. The quantum dots may include a semiconductor material such as, for example, cadmium sulfide (CdS), cadmium telluride (CdTe), zinc sulfide (ZnS), indium phosphide (InP), or the like. The size of a quantum dot may be several nanometers, and the wavelength of light after transformation may vary according to the size of the quantum dot. Any transmissive material may be used as the resin included in the first quantum dot layer 220a and the second quantum dot layer 220b. For example, polymer resin such as, for example, acryl, benzocyclobutene (BCB), or Hexamethyldisiloxane (HMDSO) may be used as a material for forming the first quantum dot layer 220a and the second quantum dot layer 220b.

In the third pixel PX3, light of a first wavelength generated in the intermediate layer 320 may be emitted to the outside without wavelength transformation. Accordingly, the third pixel PX3 may not include a quantum dot layer. For example, the transparent layer 220c may transmit light of a wavelength in a range from about 450 nm to about 495 nm without performing a light conversion operation. The light of a wavelength in a range from about 450 nm to about 495 nm may be scattered by the light scattering particles within the transparent layer 220c, and be emitted. In this case, compared to amounts of light emitted through the first quantum dot layer 220a and the second quantum dot layer 220b, which are color converted, the amount of light emitted through the transparent layer 220c that is not color converted may be greater. Likewise, as a quantum dot layer may not be needed in the first-3 opening 241c, the transparent layer 220c formed of transmissive resin may be located therein. The transparent layer 220c may include, for example, acryl, benzocyclobutene (BCB), or Hexamethyldisiloxane (HMDSO). In some cases, unlike the illustration of FIG. 12, the transparent layer 220c may not exist in the first-3 opening 241c.

In the display apparatus 1 according to the present embodiment, light in a second wavelength band is emitted to the outside in the first pixel PX1, the light in the third wavelength band is emitted to the outside in the second pixel PX2, and the light in the first wavelength band is emitted to the outside in the third pixel PX3. Accordingly, the display apparatus 1 according to the present embodiment may display a full color image. For example, the first pixel PX1, the second pixel PX2, and the third pixel PX3 may emit red light, green light, and blue light, respectively, to the outside.

A second upper insulating layer 250 is arranged on the first upper insulating layer 240. The second upper insulating layer 250 may include a second-1 opening 251a corresponding to the first-1 opening 241a, a second-2 opening 251b corresponding to the first-2 opening 241b, and a second-3 opening 251 corresponding to the first-3 opening 241c.

The first quantum dot layer 220a and the second quantum dot layer 220b respectively located in the first-1 opening 241a and the first-2 opening 241b may be formed in the inkjet printing method, and the second-1 opening 251a and the second-2 opening 251b may be paths through which ink sprayed through a nozzle during inkjet printing drops and moves. The ink moved through the second upper insulating layer 250 including the second-1 opening 251a and the second-2 opening 251b may arrive at the insides of the first-1 opening 241a and the first-2 opening 241b, and may form the first quantum dot layer 220a and the second quantum dot layer 220b, respectively.

The second upper insulating layer 250 may include a light shield material. For example, the light shield material may include at least one of, for example, a black pigment, a black dye, black particles, or metal particles. Furthermore, in an embodiment of the present disclosure, the second upper insulating layer 250 may be blue. As described above, while the first upper insulating layer 240 may include a light shield material, to form the first quantum dot layer 220a and the second quantum dot layer 220b in the inkjet printing method, materials for forming the first upper insulating layer 240 and the second upper insulating layer 250 may be different from each other.

In an embodiment of the present disclosure, the second upper insulating layer 250 that is a path through which the ink sprayed through the nozzle during inkjet printing moves may include a material that has no affinity with the ink. Furthermore, the first upper insulating layer 240 in which the first quantum dot layer 220a and the second quantum dot layer 220b are formed as the ink is accumulated may include a material that has affinity with the ink.

Although FIG. 12 illustrates both of the first upper insulating layer 240 and the second upper insulating layer 250, the second upper insulating layer 250 may be omitted, and only the first upper insulating layer 240 may be arranged on the upper substrate 200.

A filling material 600 may be further arranged between the lower substrate 100 and the upper substrate 200. The filling material 600 may perform a buffering action to an external pressure, and the like. The filling material 600 may include an organic material such as, for example, methyl silicone, phenyl silicone, polyimide, or the like. However, the present disclosure is not limited thereto, and the filling material 600 may include an organic sealant such as, for example, urethane-based resin, epoxy-based resin, or acrylic resin, or an inorganic sealant such as silicon, or the like.

Although only the display apparatus is mainly described above, the present disclosure is not limited thereto. For example, a method of manufacturing the display apparatus may also belong to the scope of the present disclosure.

According to an embodiment of the present disclosure configured as above, a display apparatus, in which failure to perform a normal operation by a pixel circuit and a light-emitting element may be prevented, may be implemented. The scope of the present disclosure is not limited by the above effects.

It should be understood that embodiments described herein should be considered in a descriptive sense only and not for purposes of limitation. Descriptions of features or aspects within each embodiment should typically be considered as available for other similar features or aspects in other embodiments. While specific embodiments have been described with reference to the figures, it will be understood by those of ordinary skill in the art that various changes in form and details may be made therein without departing from the spirit and scope of the present disclosure as defined by the appended claims.

What is claimed is:

1. A display apparatus comprising:
a substrate comprising a display area and a peripheral area outside the display area;
a thin film transistor arranged on the substrate corresponding to the display area and comprising a semiconductor layer and a gate electrode;
a pad electrode arranged on the substrate corresponding to the peripheral area and comprising an oxide semiconductor material the same as that of the semiconductor layer; and
a first insulating layer arranged on the thin film transistor and the pad electrode and comprising an opening that partially exposes a top surface of the pad electrode with a bottom of the opening positioned at the partially exposed top surface,
wherein the first insulating layer overlaps both edges of the pad electrode in a direction perpendicular to a top surface of the substrate, is not in direct contact with a side surface of one edge of the both edges of the pad electrode, and is in direct contact with a side surface of an other edge of the both edges of the pad electrode, and
the both edges of the pad electrode are located respectively at two opposite edges of the pad electrode in a horizontal direction parallel to the top surface of the substrate.

2. The display apparatus of claim 1, wherein the pad electrode comprises a first portion corresponding to the opening and a second portion outside the first portion, and a thickness of the first portion is smaller than a thickness of the second portion.

3. The display apparatus of claim 2, wherein the thickness of the second portion is the same as a thickness of the semiconductor layer.

4. The display apparatus of claim 1, wherein the pad electrode comprises a first portion corresponding to the opening and a second portion outside the first portion, and a thickness of the second portion is greater than a thickness of the semiconductor layer.

5. The display apparatus of claim 4, wherein a thickness of the first portion is the same as the thickness of the semiconductor layer.

6. The display apparatus of claim 1, wherein the pad electrode has a multilayer structure.

7. The display apparatus of claim 6, wherein the pad electrode comprises a first layer and a second layer different from the first layer.

8. The display apparatus of claim 7, wherein the second layer is arranged on the first layer and comprises a crystalline material.

9. The display apparatus of claim 1, wherein at least a part of the pad electrode is conductive.

10. The display apparatus of claim 1, further comprising a first pad connection electrode that comprises a material the same as that of the gate electrode, is arranged on the pad electrode, and partially contacts the pad electrode.

11. The display apparatus of claim 10, further comprising a second insulating layer that is provided between the pad electrode and the first pad connection electrode and covers the one edge of the both edges of the pad electrode,
    wherein a side surface of the second insulating layer overlapping the pad electrode is surrounded by the first pad connection electrode.

12. The display apparatus of claim 10, further comprising a second pad connection electrode that is arranged under the pad electrode and is electrically connected to the first pad connection electrode.

13. The display apparatus of claim 1, further comprising:
    a gate insulating layer that comprises a first gate insulating layer provided between the semiconductor layer and the gate electrode and overlapping the gate electrode, and a second gate insulating layer covering an end of the semiconductor layer;
    an electrode layer that is arranged on the second gate insulating layer and partially contacts the semiconductor layer;
    a buffer layer that is arranged under the semiconductor layer; and
    a metal layer that is spaced apart from the semiconductor layer with the buffer layer interposed therebetween,
    wherein the electrode layer and the metal layer are connected to each other through a contact hole that is defined in the buffer layer and the second gate insulating layer.

14. The display apparatus of claim 13, wherein the semiconductor layer has a hole that partially exposes the buffer layer.

15. The display apparatus of claim 13, further comprising a storage capacitor that comprises a lower electrode located on a layer the same as that of the metal layer and an upper electrode located on a layer the same as that of the semiconductor layer.

* * * * *